(12) United States Patent
Kang et al.

(10) Patent No.: US 12,423,182 B2
(45) Date of Patent: Sep. 23, 2025

(54) MEMORY DEVICE AND OPERATION METHOD THEREOF

(71) Applicant: Samsung Electronics Co., Ltd., Suwon-si (KR)

(72) Inventors: Seongmuk Kang, Suwon-si (KR); Kyung-Ho Lee, Suwon-si (KR); Myungkyu Lee, Suwon-si (KR); Ki-Heung Kim, Suwon-si (KR); Kyomin Sohn, Suwon-si (KR); Kijun Lee, Suwon-si (KR); Sunghye Cho, Suwon-si (KR); Hyongryol Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/399,864

(22) Filed: Dec. 29, 2023

(65) Prior Publication Data

US 2024/0232012 A1    Jul. 11, 2024

(30) Foreign Application Priority Data

Jan. 10, 2023    (KR) .......................... 10-2023-0003726

(51) Int. Cl.
  *G06F 11/10*    (2006.01)
  *G11C 7/06*    (2006.01)
  (Continued)

(52) U.S. Cl.
  CPC ............ *G06F 11/1068* (2013.01); *G11C 7/06* (2013.01); *G11C 7/1078* (2013.01); *G11C 7/12* (2013.01); *G11C 29/42* (2013.01)

(58) Field of Classification Search
  CPC ............ G06F 11/1068; G06F 11/1048; G06F 11/1044; G11C 7/06; G11C 7/1078; G11C 7/12; G11C 29/42; G11C 5/025; G11C 11/4091; G11C 7/1006; G11C 11/4096; G11C 29/52; G11C 29/1201; G11C 29/18;
  (Continued)

(56) References Cited

U.S. PATENT DOCUMENTS 8,984,367 B2    3/2015    Ekas et al.
9,524,210 B1    12/2016    Asnaashari
(Continued)

FOREIGN PATENT DOCUMENTS

KR    10-2019-0139082 A    12/2019
KR    10-2022-0083883 A    6/2022

*Primary Examiner* — James C Kerveros
(74) *Attorney, Agent, or Firm* — Muir Patent Law, PLLC

(57) ABSTRACT

A memory device includes an ECC circuit that performs error correction code (ECC) encoding on input data to generate write data, and a memory cell array including a plurality of memory cells that stores the write data. The ECC circuit includes a data splitter that splits the input data into first sub-data and second sub-data, a first ECC encoder that performs ECC encoding on the first sub-data to generate first sub-parity data, a second ECC encoder that performs ECC encoding on the second sub-data to generate second sub-parity data, and a data scrambler that performs a data scrambling operation with respect to the first sub-data, the second sub-data, the first sub-parity data, and the second sub-parity data based on a structure of the memory cell array to generate the write data.

20 Claims, 25 Drawing Sheets

(51) Int. Cl.
*G11C 7/10* (2006.01)
*G11C 7/12* (2006.01)
*G11C 29/42* (2006.01)

(58) Field of Classification Search
CPC ............ G11C 29/36; G11C 2029/1802; G11C 11/4085
USPC .......................................................... 714/764
See application file for complete search history.

(56) References Cited

U.S. PATENT DOCUMENTS

| | | |
|---|---|---|
| 9,720,769 B2 | 8/2017 | Manohar et al. |
| 10,601,546 B2 | 3/2020 | Kumar et al. |
| 11,106,535 B2 | 8/2021 | Cho et al. |
| 2005/0213442 A1* | 9/2005 | Sako .................... G11B 27/105 369/30.07 |
| 2012/0278687 A1* | 11/2012 | Sharon ................ G06F 11/1048 714/790 |
| 2019/0377632 A1 | 12/2019 | Oh et al. |
| 2020/0162964 A1* | 5/2020 | Srinivasa ............ H04W 28/065 |
| 2020/0233743 A1* | 7/2020 | Lien ........................ H04K 1/06 |
| 2021/0303425 A1* | 9/2021 | Pozidis ............... H03M 13/154 |
| 2021/0365316 A1 | 11/2021 | Nale et al. |
| 2022/0188013 A1 | 6/2022 | Woo et al. |

\* cited by examiner

MEMORY DEVICE AND OPERATION METHOD THEREOF

CROSS-REFERENCE TO RELATED APPLICATION

This application claims priority under 35 U.S.C. § 119 to Korean Patent Application No. 10-2023-0003726, filed on Jan. 10, 2023, in the Korean Intellectual Property Office, the disclosure of which is incorporated by reference herein in its entirety.

BACKGROUND

Embodiments of the present disclosure described herein relate to a semiconductor memory, and more particularly, relate to a memory device and an operation method thereof.

A semiconductor memory may include a volatile memory, in which stored data leaks when power is turned off, such as a static random access memory (SRAM) or a dynamic random access memory (DRAM), and may include a non-volatile memory, in which stored data are retained even when power is turned off, such as a flash memory, a phase-change RAM (PRAM), a magnetic RAM (MRAM), a resistive RAM (RRAM), or a ferroelectric RAM (FRAM).

DRAM is widely used as system memory in mobile devices and/or computer devices. DRAM devices may include an error correction code (ECC) circuit for improving reliability of stored data. For example, ECC circuits may have a predetermined level of error correction capability. However, there are instances in which errors of a specific pattern occurring in the DRAM cannot be corrected.

SUMMARY

Embodiments of the present disclosure provide a memory device with improved reliability and an operation method thereof.

According to an embodiment of the present disclosure, a memory device includes: an ECC circuit that performs error correction code (ECC) encoding on input data to generate write data; and a memory cell array including a plurality of memory cells that stores the write data, and the ECC circuit includes: a data splitter that splits the input data into first sub-data and second sub-data; a first ECC encoder that performs ECC encoding on the first sub-data to generate first sub-parity data; a second ECC encoder that performs ECC encoding on the second sub-data to generate second sub-parity data; and a data scrambler that performs a data scrambling operation with respect to the first sub-data, the second sub-data, the first sub-parity data, and the second sub-parity data based on a structure of the memory cell array to generate the write data.

According to an embodiment of the present disclosure, a memory device includes: a plurality of memory cells connected to a first word line and respectively connected to a plurality of bit lines; a first local sense amplifier connected to first bit lines of the plurality of bit lines and that operates in response to a first column select signal; a second local sense amplifier connected to second bit lines of the plurality of bit lines and that operates in response to the first column select signal; and an ECC circuit that splits input data into first sub-data and second sub-data, performs a first ECC encoding on the first sub-data to generate a first data code, performs a second ECC encoding on the second sub-data to generate a second data code, and generates write data based on the first data code and the second data code, and the write data is stored in the plurality of memory cells, and first memory cells connected to the first bit lines among the plurality of memory cells store a first 2-bit symbol corresponding to the first data code and a second 2-bit symbol corresponding to the second data code.

According to an embodiment of the present disclosure, a method of operating a memory device including a plurality of memory cells connected to a first word line and respectively connected to a plurality of bit lines includes: dividing input data into a plurality of sub-data; performing ECC (Error Correction Code) encoding on each of the plurality of sub-data to generate a plurality of first data codes; performing a data scrambling operation on the plurality of first data codes to generate write data; and storing the write data in the plurality of memory cells, and the memory device includes: a first local sense amplifier connected to first bit lines of the plurality of bit lines and that operates in response to a first column select signal, and first memory cells connected to the first bit lines among the plurality of memory cells store 2-bit symbols corresponding to data codes among the plurality of first data codes.

BRIEF DESCRIPTION OF THE DRAWINGS

A detailed description of each drawing is provided to facilitate a more thorough understanding of the drawings referenced in the detailed description of the present disclosure.

DETAILED DESCRIPTION

Hereinafter, embodiments of the present disclosure are described in detail such that a person of ordinary skill in the art may easily understand and implement one or more embodiments of the present disclosure.

According to one or more embodiments of the present disclosure, an ECC circuit of a memory device may split input data into a plurality of sub-data based on a structure of a memory cell array, and may perform ECC encoding on each of the plurality of sub-data to generate a plurality of sub-parity data. The ECC circuit may generate write data by performing a data scrambling operation on the plurality of sub-data and the plurality of sub-parity data. In this case, the write data may be generated such that one 2-bit symbol of each sub-data is stored in memory cells corresponding to one local sense amplifier. As such, when a specific pattern of errors occurs, since a 2-bit symbol error may be corrected for each split sub-data, the specific pattern of errors may be normally corrected.

Figure 1:
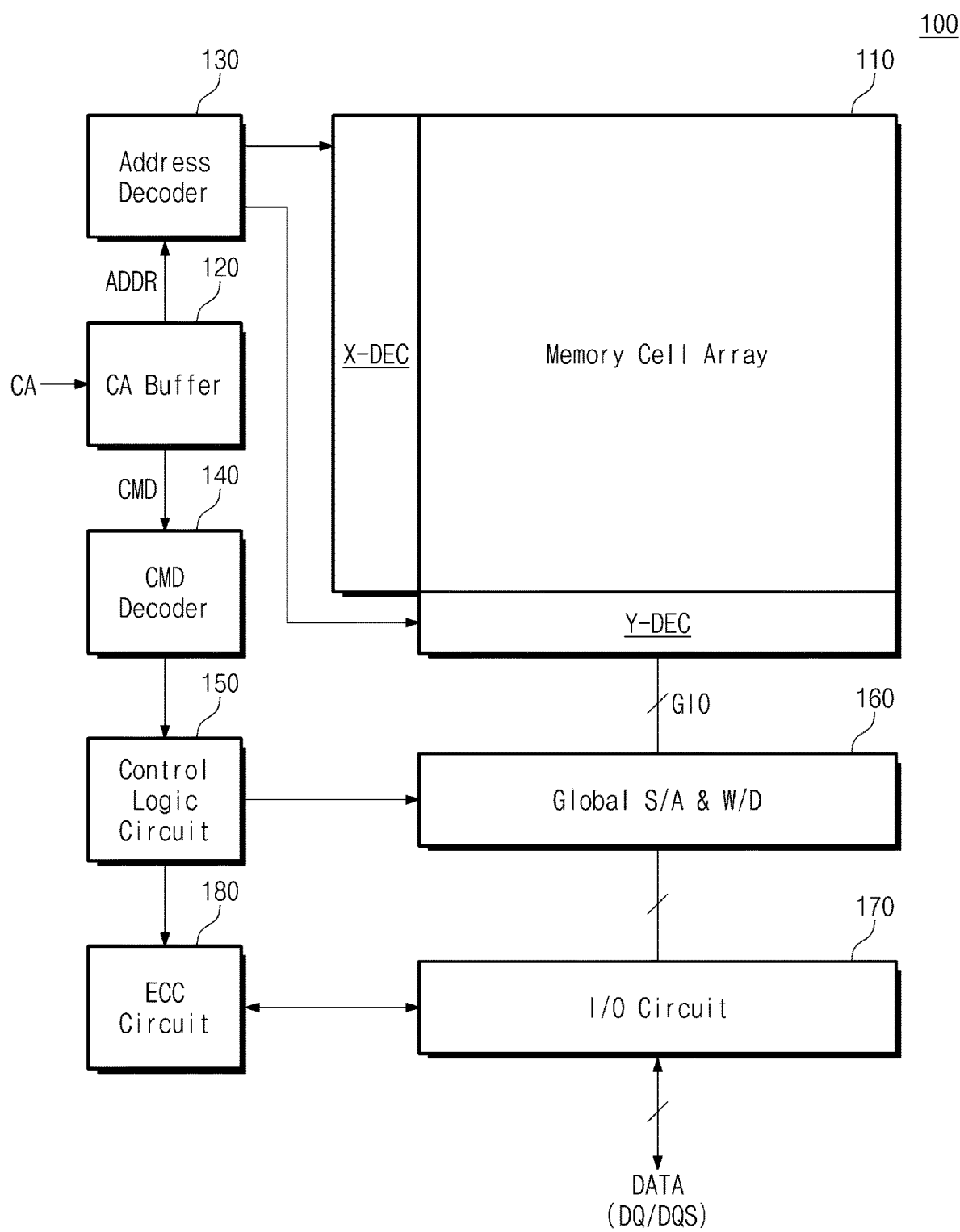
FIG. 1 is a block diagram illustrating a memory device, according to an embodiment of the present disclosure.

FIG. 1 is a block diagram illustrating a memory device according to an embodiment of the present disclosure. Referring to FIG. 1, a memory device 100 may include a memory cell array 110, a command and address (CA) buffer 120, an address decoder 130, a command decoder 140, a control logic circuit 150, a global sense amplifier and write driver 160, an input/output circuit 170, and an error correction code (ECC) circuit 180. In an embodiment, the memory device 100 may be a dynamic random access memory (DRAM) device, but the scope of the present disclosure is not limited thereto.

The memory cell array 110 may include a plurality of memory cells. The plurality of memory cells may be aligned in a row direction and a column direction, and may be connected to word lines and bit lines. In an embodiment, each of the plurality of memory cells may be a DRAM cell including an access transistor and a storage capacitor. In an embodiment, a plurality of word lines may be driven by an X-decoder (or row decoder) (X-DED), and a plurality of bit lines may be driven by a Y-decoder (or column decoder) (Y-DEC).

The CA buffer 120 may be configured to receive a command/address CA from an external device (e.g., a memory controller) and to buffer the received signals.

The address decoder 130 may receive an address ADDR from the CA buffer 120 and may decode the received address ADDR. The address decoder 130 may control word lines of the memory cell array 110 based on a decoding result. For example, the word lines of the memory cell array 110 may be connected to the row decoder X-DEC. The address decoder 130 may control the word lines of the memory cell array 110 by controlling the row decoder X-DEC. The address decoder 130 may control bit lines of the memory cell array 110 or global input/output lines GIO based on a decoding result. For example, the address decoder 130 may generate a column select signal based on a decoding result, and the column decoder Y-DEC may control or select a plurality of bit lines connected to the memory cell array 110 based on the column select signal.

The command decoder 140 may decode a command CMD stored in the CA buffer 120. The control logic circuit 150 may control components of the memory device 100 based on the decoded result of the command decoder 140. For example, when a command signal stored in the CA buffer 120 is a write command, the control logic circuit 150 may control an operation (i.e., activating the write driver) of the global sense amplifier and write driver 160 in response to the decoding result of the command decoder 140 such that data "DATA" received through the input/output circuit 170 is written in the memory cell array 110. Alternatively, when a command signal stored in the CA buffer 120 is a read command, the control logic circuit 150 may control an operation (i.e., activating the sense amplifier) of the global sense amplifier and write driver 160 in response to the decoding result of the command decoder 140 such that data stored in the memory cell array 110 is read.

The global sense amplifier and write driver 160 may store data in the memory cell array 110 or may read data stored in the memory cell array 110 under the control of the control logic circuit 150. In an embodiment, the global sense amplifier and write driver 160 may be connected to the memory cell array 110 through the global input/output lines GIO.

The input/output circuit 170 may exchange the data "DATA" with an external device (e.g., a memory controller) through data lines and data strobe lines DQ/DQS.

In a write operation, the ECC circuit 180 is configured to correct errors in data to be stored in the memory cell array 110. For example, the ECC circuit 180 may generate parity data by performing ECC encoding on first data to be stored in the memory cell array 110. The generated parity data may be stored in the memory cell array together with the first data. In a read operation, the ECC circuit 180 may be configured to perform ECC decoding based on the first data and the parity data read from the memory cell array 110 to correct errors in the read first data.

The ECC circuit 180 may not correct errors that exceed a predetermined level. For example, the ECC circuit 180 may perform an error correction operation based on a single 2-bit-symbol error correction (S2EC) code. In this case, the ECC circuit 180 may correct a 1-bit random error or a 2-bit symbol error of target data. The 2-bit symbol error indicates adjacent 2-bits among bits of target data. For example, when the target data is a bit string of [b1, b2, b3, b4, b5, b6, b7, and b8], the 2-bit-symbol may indicate [b1 and b2], [b3 and b4], [b5 and b6], or [b7 and b8]. That is, when an error occurs in one 2-bit-symbol of [b1 and b2], [b3 and b4], [b5 and b6], and [b7 and b8], the ECC circuit 180 uses the S2EC code to correct the error of target data. However, the 2-bit-symbol described above is not limited thereto, and may include other combinations of adjacent bits and a bit string may be larger or smaller than the 8-bit bit string described above.

In an embodiment, various patterns of errors may occur in data stored in the memory cell array 110 according to a structure of the memory cell array 110. For example, when an error occurs due to the structure of the memory cell array 110, a 4-bit error having a specific pattern may occur in target data. According to an embodiment of the present disclosure, the ECC circuit 180 may split target data into a plurality of sub-data and may perform individual ECC encoding/decoding on each of the plurality of sub-data, thereby correcting errors of a specific pattern that occurred in the target data. The configuration and operation of the ECC circuit 180 according to an embodiment of the present disclosure will be described in more detail with reference to the following drawings.

Figure 2:
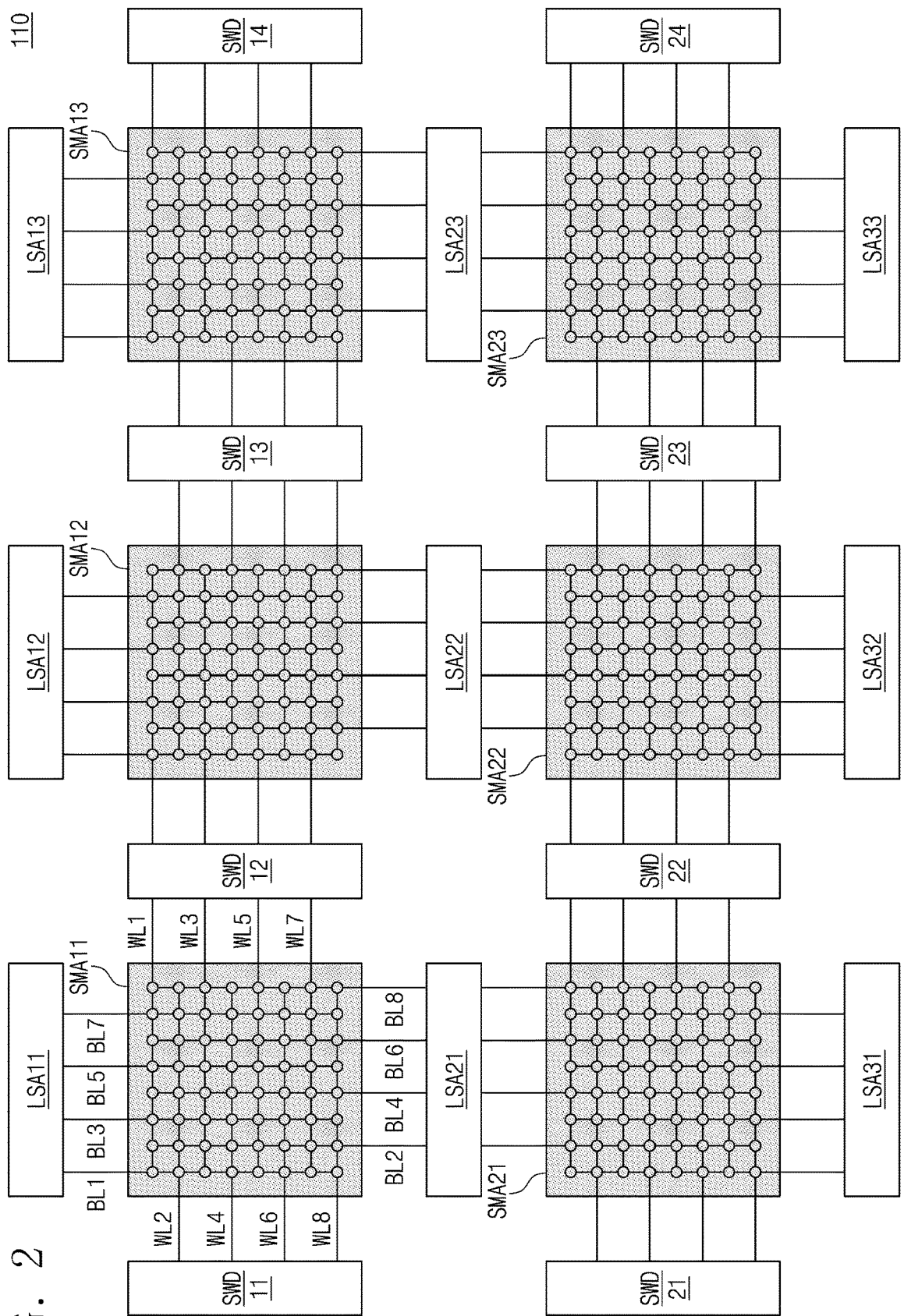
FIG. 2 is diagram illustrating a memory cell array according to an embodiment.

FIG. 2 is diagram illustrating a memory cell array of FIG. 1, according to an embodiment. For brevity of the drawing, in FIG. 2, some configurations of the memory cell array 110 are illustrated, but the scope of the present disclosure is not limited thereto.

Referring to FIGS. 1 and 2, the memory cell array 110 may include a plurality of sub-memory cell arrays SMA11 to SMA23 (hereinafter referred to as "sub-array" for convenience of description), a plurality of sub-word line drivers SWD11 to SWD24, and a plurality of local sense amplifiers LSA11 to LSA33.

Each of the plurality of sub-arrays SMA11 to SMA23 may include a plurality of memory cells. Each of the plurality of memory cells may be connected to word lines and bit lines. For example, the eleventh sub-array SMA11 may include a plurality of memory cells, and the plurality of memory cells may be connected to word lines WL1 to WL8 and bit lines BL1 to BL8. The remaining sub-arrays SMA12 to SMA23 may also have a structure similar to that of the eleventh sub-array SMA11, and a detailed description thereof will be omitted to avoid redundancy.

Each of the plurality of sub-word line drivers SWD11 to SWD24 may be located on a side of each of two sub-arrays of the plurality of sub-arrays SMA11 to SMA23, and may be configured to control or drive some of word lines of adjacent sub-arrays. For example, each sub-array SMA11 to SMA23 may have two sub-word line drivers from among SWD11 and SWD24 on two respective opposite sides of the sub-array. For example, the eleventh sub-word line driver SWD11 is located on the first side of the eleventh sub-array SMA11, and may be configured to drive the second, fourth, sixth, and eighth word lines WL2, WL4, WL6, and WL8. The twelfth sub-word line driver SWD12 is located on the second side opposite to the first side of the eleventh sub-array SMA11, and may be configured to drive the first, third, fifth, and seventh word lines WL1, WL3, WL5, and WL7. In an embodiment, the twelfth sub-word line driver SWD12 may be further configured to drive some (e.g., odd-numbered word lines) of the word lines of the adjacent twelfth sub-array SMA12. The remaining sub-word line drivers SWD13 to SWD24 may also have a structure similar to those of the eleventh sub-word line driver SWD11 or the twelfth sub-word line driver SWD12, and a detailed description thereof will be omitted to avoid redundancy.

The plurality of local sense amplifiers LSA11 to LSA33 may be located such that, for example, one local sense amplifier is located on an opposite side of another local sense amplifier with respect to a sub-array among the plurality of sub-arrays SMA11 to SMA23, and each of the plurality of local sense amplifiers LSA11 to LSA33 may be configured to control or drive some of the bit lines of adjacent sub-arrays. For example, the eleventh local sense amplifier LSA11 is located on the third side of the eleventh sub-array SMA11 and may be configured to control the first, third, fifth, and seventh bit lines BL1, BL3, BL5, and BL7. The twenty-first local sense amplifier LSA21 is located on the fourth side facing the third side of the eleventh sub-array SMA11 and may be configured to control the second, fourth, sixth, and eighth bit lines BL2, BL4, BL6, and BL8. In an embodiment, the twenty-first local sense amplifier LSA21 may be configured to control some (e.g., even-numbered bit lines) of the bit lines of the adjacent twenty-first sub-array SMA21. The remaining local sense amplifiers LSA12, LSA13, and LSA22 to LSA33 may have a structure similar to that of the eleventh local sense amplifier LSA11 or the twenty-first local sense amplifier LSA21, and a detailed description thereof will be omitted to avoid redundancy. Each of the plurality of local sense amplifiers LSA11 to LSA33 may be connected to the global sense amplifier and write driver 160 through global input/output lines GIO. Ordinal numbers such as "first," "second," "third," "eleventh," "twenty-first," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim in a different claim set). For example, certain components labeled with "11," "21" "28," "38," etc., may be described as "eleventh," "twenty-first," "twenty-eighth," and "thirty-eighth" simply for naming purposes, and these components may not be the eleventh, twenty-first, twenty-eighth, and thirty-eighth components in terms of an ordinal value within a series of elements (e.g., the components labeled with "11" may actual be the first component in terms or an ordinal relationship between the components).

In an embodiment, the plurality of sub-word line drivers SWD11 to SWD24 may operate under the control of the row decoder X-DEC. For example, the plurality of sub-word line drivers SWD11 to SWD24 may activate a selected word line among a plurality of word lines under the control of the row decoder X-DEC.

The plurality of local sense amplifiers LSA11 to LSA33 may operate under the control of the column decoder Y-DEC. For example, the plurality of local sense amplifiers LSA11 to LSA33 may control voltages of selected bit lines or may sense voltage changes of selected bit lines under the control of the column decoder Y-DEC. In an embodiment, the plurality of local sense amplifiers LSA11 to LSA33 may operate in response to column select signals, respectively.

For example, the eleventh, twenty-first, and thirty-first local sense amplifiers LSA11, LSA21, and LSA31 located in the same first column among the plurality of local sense amplifiers LSA11 to LSA33 operate in response to a first column select signal CSL1, the twelfth, twenty-second, and thirty-second local sense amplifiers LSA12, LSA22, and LSA32 located in the same second column may operate in response to a second column select signal CSL2, and the thirteenth, twenty-third, and thirty-third local sense amplifiers LSA13, LSA23, and LSA33 located in the same third column may operate in response to a third column select signal CSL3.

The structure of the memory cell array 110 described with reference to FIG. 2 is a simple example for convenience of description, and the scope of the present disclosure is not limited thereto. For example, the memory cell array 110 may include a plurality of additional sub-arrays, and one sub-array may include a plurality of additional memory cells.

Figure 3A:
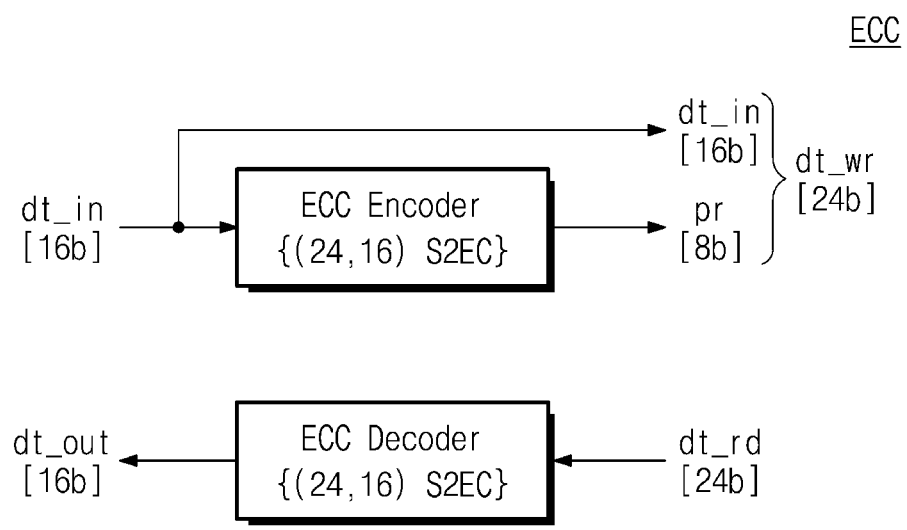
FIGS. 3A and 3B are diagrams for describing an operation of an ECC circuit according to an embodiment.
Figure 3B:
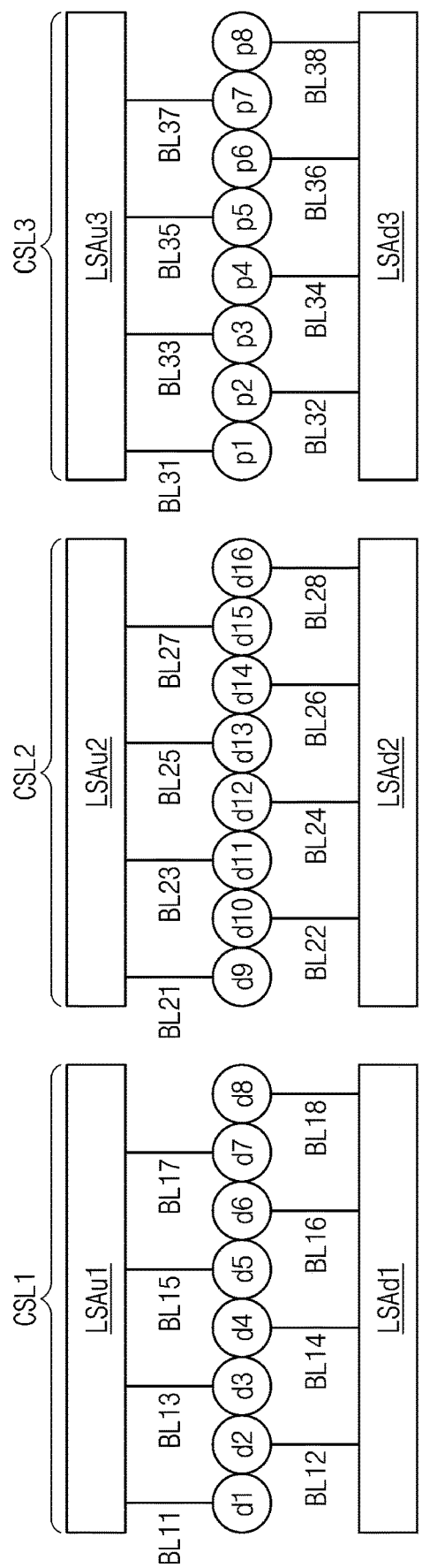

FIGS. 3A and 3B are diagrams for describing an operation of an ECC circuit. Referring to FIGS. 3A and 3B, an ECC circuit ECC may include an ECC encoder and an ECC decoder. The ECC encoder may generate 8-bit parity data pr by performing ECC encoding on 16-bit input data dt_in. In an embodiment, ECC encoding may be performed based on a (24, 16) S2EC code. In this case, the (24, 16) S2EC code may be a code configured to correct a 1-bit random error and a 2-bit symbol error with respect to 16-bit input data, using a total of 24 bits. When ECC encoding is performed based on the (24, 16) S2EC code, 8-bit parity data with respect to 16-bit input data may be generated.

The 16-bit input data dt_in and the 8-bit parity data pr may be written into the memory cell array 110 as 24-bit write data dt_wr. It is assumed that the 24-bit write data dt_wr is stored in the memory cells connected to word lines in the memory cell array 110 of FIG. 2 (e.g., the eleventh, twelfth, and thirteenth sub-arrays SMA11, SMA12, and SMA13 connected to word lines WL1 through WL8, as one example in FIG. 2). In this case, the write data dt_wr may be written into the memory cell array 110 as illustrated in FIG. 3B.

For example, the input data dt_in may include first to sixteenth data bits d1 to d16, and the parity data pr may include first to eighth parity bits p1 to p8. The first to eighth data bits d1 to d8 may be stored in memory cells connected to the eleventh to eighteenth bit lines BL11 to BL18, respectively, and the ninth to sixteenth data bits d9 to d16 may be stored in memory cells connected to the twenty-first to twenty-eighth bit lines BL21 to BL28, respectively, and the first to eighth parity bits p1 to p8 may be stored in memory cells connected to the thirty-first to thirty-eighth bit lines BL31 to BL38, respectively. In this example, a total of 24 bits are shown for each codeword (e.g., each 16-bit input date dt_in combined with its respective 8-bit parity data pr), which are written to memory cells using 24 bit lines.

Referring back to FIG. 3A, the ECC decoder may perform ECC decoding on 24-bit read data dt_rd read from the memory cell array 110 to output 16-bit output data dt_out. The 16-bit output data dt_out may be error-corrected data.

For example, as illustrated in FIG. 3B, the eleventh, thirteenth, fifteenth, and seventeenth bit lines BL11, BL13, BL15, and BL17 (e.g., a first set of bit lines) may be connected to a first upper local sense amplifier LSAu1, and the twelfth, fourteenth, sixteenth, and eighteenth bit lines BL12, BL14, BL16, and BL18 (e.g., a second set of bit lines) may be connected to a first lower local sense amplifier LSAd1. The twenty-first, twenty-third, twenty-fifth, and twenty-seventh bit lines BL21, BL23, BL25, and BL27 (e.g., a third set of bit lines) may be connected to a second upper local sense amplifier LSAu2, and the twenty-second, twenty-fourth, twenty-sixth, and twenty-eighth bit lines BL22, BL24, BL26, and BL28 (e.g., a fourth set of bit lines) may be connected to a second lower local sense amplifier LSAd2. The thirty-first, thirty-third, thirty-fifth, and thirty-seventh bit lines BL31, BL33, BL35, and BL37 (e.g., a fifth set of bit lines) are connected to a third upper local sense amplifier LSAu3, and the thirty-second, thirty-fourth, thirty-sixth, and thirty-eighth bit lines BL32, BL34, BL36, and BL38 (e.g., a sixth set of bit lines) may be connected to a third lower local sense amplifier LSAd3.

The first upper local sense amplifier LSAu1 and the first lower local sense amplifier LSAd1 may operate in response to the first column select signal CSL1, the second upper local sense amplifier LSAu2 and the second lower local sense amplifier LSAd2 may operate in response to the second column select signal CSL2, and the third upper local sense amplifier LSAu3 and the third lower local sense amplifier LSAd3 may operate in response to the third column select signal CSL3. For example, one local sense amplifier may include one or more sense amplification circuits configured to operate in response to at least one column select signal.

As the first to third upper local sense amplifiers LSAu1 to LSAu3 and the first to third lower local sense amplifiers LSAd1 to LSAd3 operate, the first to sixteenth data bits d1 to d16 and the first to eighth parity bits p1 to p8 stored in the memory cells may be read as read data dt_rd.

In one example, it is assumed that errors occur in the first and second data bits d1 and d2. In this case, since the ECC decoder performs ECC decoding based on the (24, 16) S2EC code, the error (i.e., 2-bit symbol error) of the first and second data bits d1 and d2 may be corrected.

In an embodiment, in the structure illustrated in FIG. 3B, a 4-bit error of a specific pattern may occur. For example, when a structural defect occurs in the first upper local sense amplifier LSAu1, errors in the first, third, fifth, and seventh data bits d1, d3, d5, and d7 may occur. In this case, since the errors with respect to the first, third, fifth, and seventh data bits d1, d3, d5, and d7 are not 1-bit errors or 2-adjacent bit symbol errors, the errors cannot be corrected.

As described above, errors of a specific pattern due to the structural characteristics of the memory cell array 110 may occur, and an error correction method or technique for fixing such errors is desirable.

Figure 4:
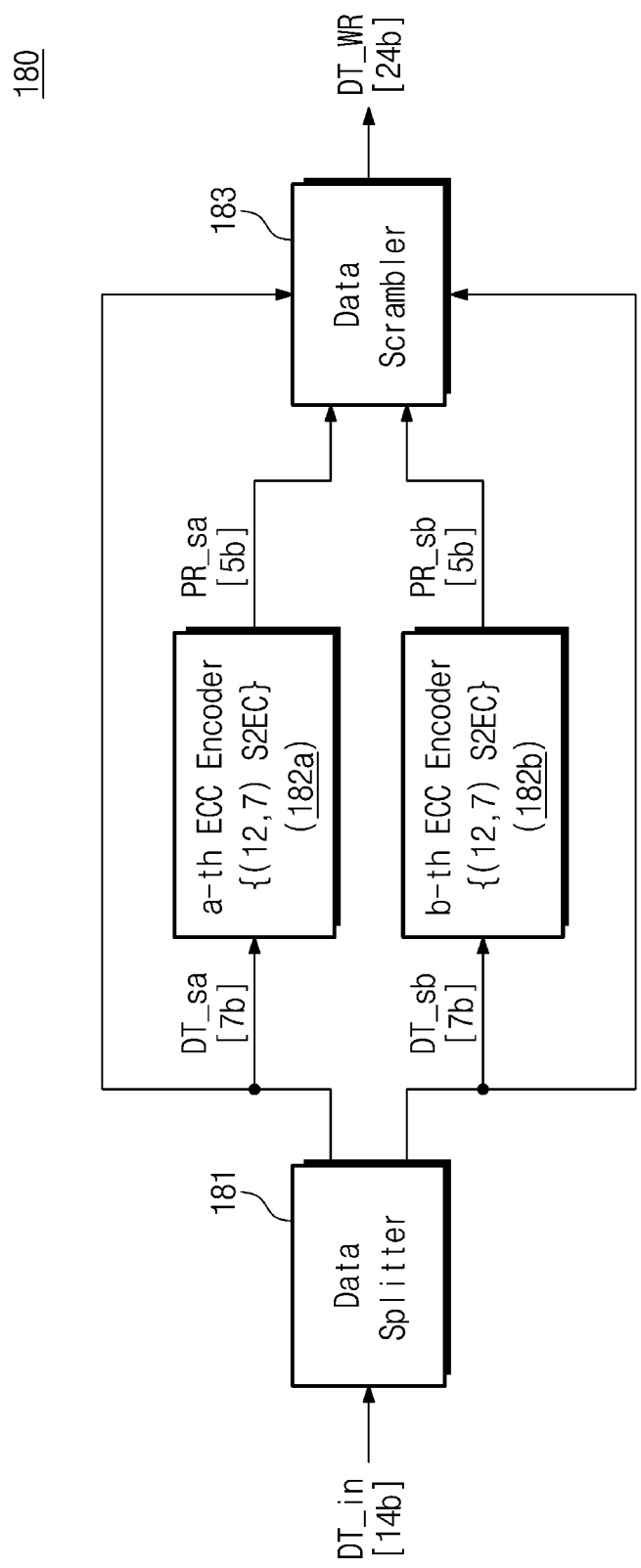
FIG. 4 is a block diagram illustrating an ECC circuit of a memory device of FIG. 1 according to an embodiment.

FIG. 4 is a block diagram illustrating an ECC circuit of a memory device of FIG. 1. Hereinafter, for convenience of description, bits of various data will be described as having a specific number. However, it will be understood that the scope of the present disclosure is not limited thereto, and the number of bits of each of various data may be variously modified based on structural characteristics of the memory device 100.

Referring to FIGS. 1 and 4, the ECC circuit 180 may include a data splitter 181, an a-th ECC encoder 182*a*, a b-th ECC encoder 182*b*, and a data scrambler 183.

The data splitter 181 may split the input data DT_in into a-th sub-data DT_sa and b-th sub-data DT_sb. For example, the data splitter 181 may receive the input data DT_in. The input data DT_in may have a size of 14-bits. The data splitter 181 may split the input data DT_in into the a-th sub-data DT_sa and the b-th sub-data DT_sb such that each of the a-th sub-data DT_sa and the b-th sub-data DT_sb has a size of 7-bits 7*b*.

The a-th ECC encoder 182*a* may generate a-th sub-parity data PR_sa by performing ECC encoding on the a-th sub-data DT_sa. For example, the a-th ECC encoder 182*a* may generate the a-th sub-parity data PR_sa by performing ECC encoding on the a-th sub-data DT_sa based on the (12, 7) S2EC code. The a-th sub-parity data PR_sa may have a size of 5-bits 5*b*. In an embodiment, the a-th data code may be generated by ECC encoding of the a-th ECC encoder 182*a*, and an a-th data code may include the a-th sub-data and the a-th sub-parity data. In this case, the a-th data code may have a size of 12-bits.

The b-th ECC encoder 182*b* may perform ECC encoding on the b-th sub-data DT_sb to generate b-th sub-parity data PR_sb. For example, the b-th ECC encoder 182*b* may generate the b-th sub-parity data PR_sb by performing ECC encoding on the b-th sub-data DT_sb based on the (12, 7) S2EC code. The b-th sub-parity data PR_sb may have a size of 5-bits 5*b*. In an embodiment, the b-th data code may be generated by ECC encoding of the b-th ECC encoder 182*b*, and the b-th data code may include the b-th sub-data and the b-th sub-parity data. In this case, the b-th data code may have a size of 12-bits.

The data scrambler 183 may perform data scrambling on the a-th sub-data DT_sa, the b-th sub-data DT_sb, the a-th sub-parity data PR_sa, and the b-th sub-parity data PR_sb to generate write data DT_WR. The write data DT_WR may have a size of 24-bits 24*b*. In an embodiment, the a-th sub-data DT_sa and the a-th sub-parity data PR_sa may be included in the a-th data code, and the b-th sub-data DT_sb and the b-th sub-parity data PR_sb may be included in the b-th data code, and the data scrambler 183 may generate the write data DT_WR by performing a data scrambling operation with respect to the a-th data code and the b-th data code.

In an embodiment, the data scrambler 183 may perform the data scrambling with respect to the a-th sub-data DT_sa, the b-th sub-data DT_sb, the a-th sub-parity data PR_sa, and the b-th sub-parity data PR_sb based on the structure of the memory cell array 110. The structure may relate to an arrangement of circuits for the memory cell array 110, where the data scrambling outputs different data bits to different bit lines depending on a physical layout and/or electrical connections between the different circuits of the memory cell array and peripheral circuitry. For example, the data may be scrambled based on a connection among bit lines to a plurality of local sense amplifiers. As one specific example, the data scrambler 183 may perform the scrambling with respect to data such that one 2-bit symbol of each sub-data is stored in memory cells corresponding to one local sense amplifier. In this case, even if an error of a specific pattern (e.g., a 4-bit error due to a defect in the local sense amplifier) occurs, error correction is possible. This will be described in more detail with reference to FIGS. 5 and 6.

In an embodiment, the size of each of the input data DT_in, the sub-data DT_sa and DT_sb, and the sub-parity data PR_sa and PR_sb may be determined such that the size of the write data DT_WR is suitable for the structure of the memory cell array 110. For example, the size (i.e., the number of bits) of the write data DT_WR may be a multiple of 8 according to the structure of the memory cell array 110. When the size of the write data DT_WR is 24-bits 24*b*, the input data DT_in will be 14-bits 14*b*, each of the sub-data DT_sa and DT_sb will be 7-bits 7*b*, and each of the sub-parity data Pr_sa and PR_sb will be 5-bits 5*b*. However, the scope of the present disclosure is not limited thereto.

Figure 5:
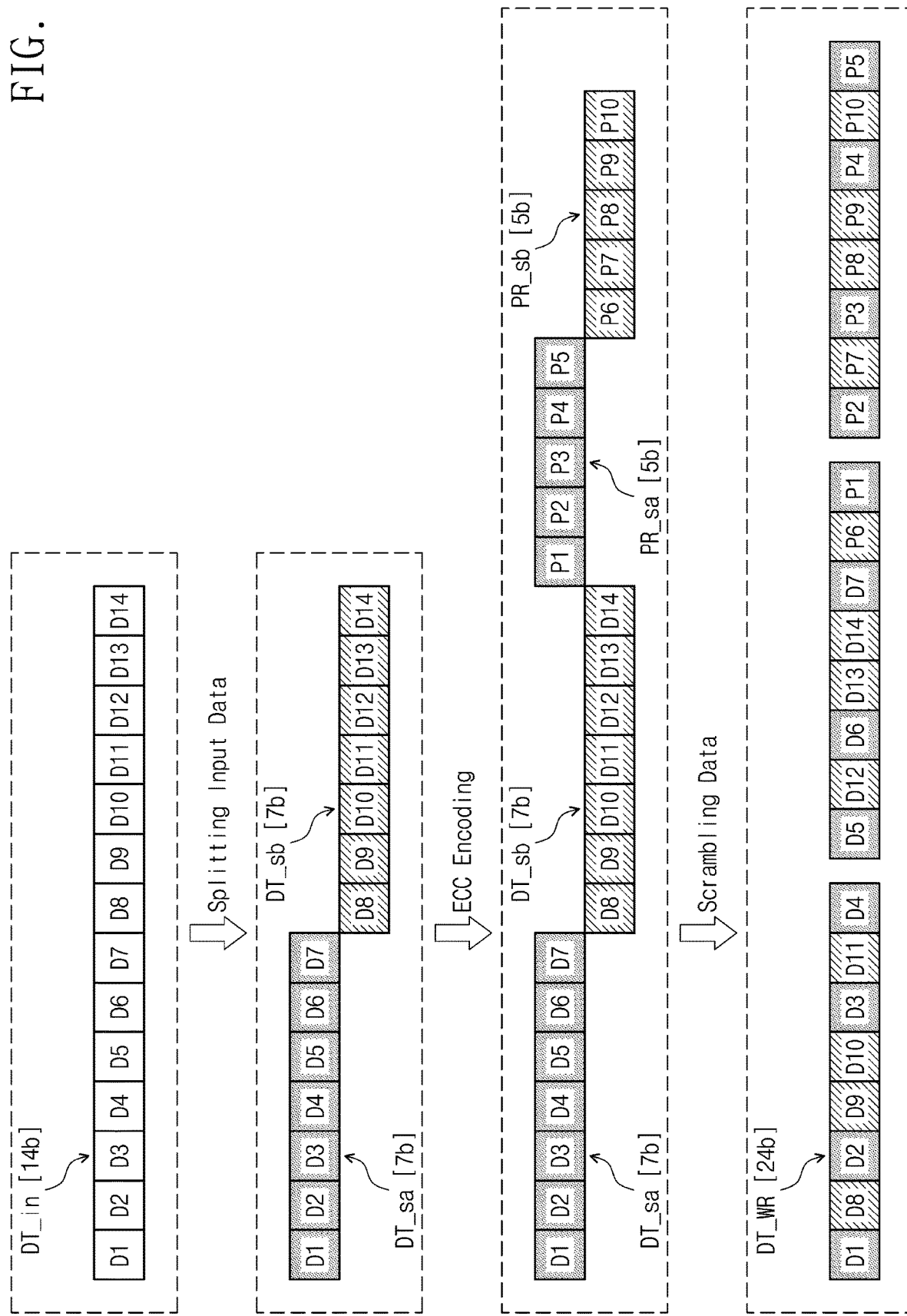
FIG. 5 is a diagram for describing an operation of an ECC circuit of FIG. 4.

FIG. 5 is a diagram for describing an operation of an ECC circuit of FIG. 4. Referring to FIGS. 1, 4, and 5, the input data DT_in may include a bit string of first to fourteenth data bits D1 to D14. The input data DT_in may be split into the a-th sub-data DT_sa and the b-th sub-data DT_sb by the data splitter 181. For example, when the input data DT_in is split, each of the a-th sub-data DT_sa and the b-th sub-data DT_sb may have a size of 7-bits 7*b*. The a-th sub-data DT_sa may include a bit string of the first to seventh data bits D1 to D7, and the b-th sub-data DT_sb may include a bit string of the eighth to fourteenth data bits D8 to D14.

Subsequently, the a-th ECC encoder 182*a* may perform ECC encoding on the a-th sub-data DT_sa to generate the a-th sub-parity data PR_sa, and the b-th ECC encoder 182*b* may perform ECC encoding on the b-th sub-data DT_sb to generate the b-th sub-parity data PR_sb. The a-th sub-parity data PR_sa may include a bit string of the first to fifth parity bits P1 to P5, and the b-th sub-parity data PR_sb may include a bit string of the sixth to tenth parity bits P6 to P10.

Subsequently, the data scrambler 183 may perform data scrambling on the a-th sub-data DT_sa, the b-th sub-data DT_sb, the a-th sub-parity data PR_sa, and the b-th sub-parity data PR_sb to generate the write data DT_WR. As described above, the data scrambling may be performed based on the structure of the memory cell array 110. In the memory cell array 110, when it is assumed that the structure of the area where the write data DT_WR is to be written/stored is configured as illustrated in FIG. 3B, the write data DT_WR may include a bit string of 24-bits as illustrated in FIG. 5. The configuration of the write data DT_WR will be described in detail with reference to FIG. 6.

Figure 6:
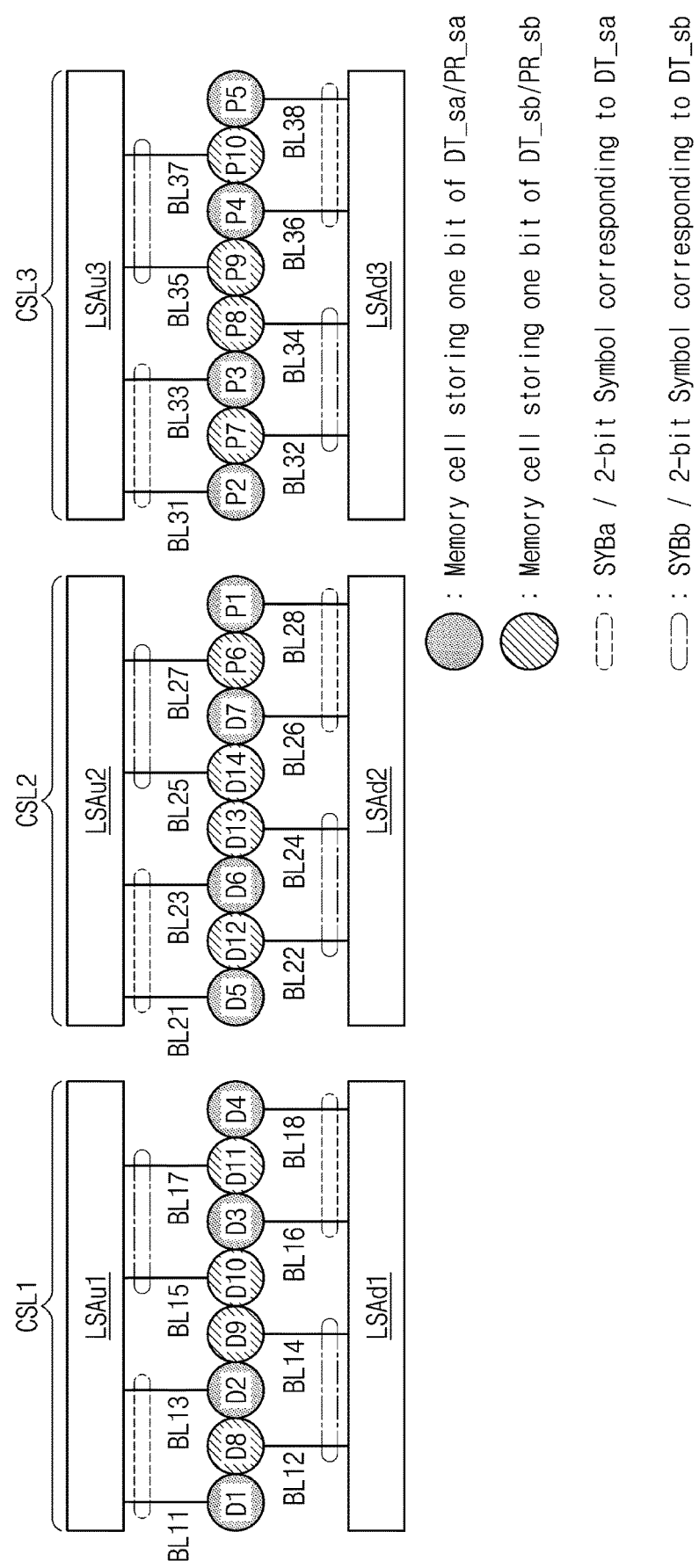
FIG. 6 is a diagram illustrating a partial area of a memory cell array in which write data of FIG. 5 is written.

FIG. 6 is a diagram illustrating a partial area of a memory cell array in which write data of FIG. 5 is written. Referring to FIGS. 1, 4, 5, and 6, the write data DT_WR may be generated by the ECC encoding operation of the ECC circuit 180 with respect to the input data DT_in. In an embodiment, the order of bit strings of the write data DT_WR may be determined based on the structure of the memory cell array 110.

For example, as illustrated in FIG. 6, a plurality of memory cells may be respectively connected to a plurality of bit lines BL11 to BL18, BL21 to BL28, and BL31 to BL38. In an embodiment, a plurality of memory cells may be connected to the same word line.

The eleventh, thirteenth, fifteenth, and seventeenth bit lines BL11, BL13, BL15, and BL17 may be connected to the first upper local sense amplifier LSAu1, and the twelfth, fourteenth, sixteenth, and eighteenth bit lines BL12, BL14, BL16, and BL18 may be connected to the first lower local sense amplifier LSAd1. The twenty-first, twenty-third, twenty-fifth, and twenty-seventh bit lines BL21, BL23, BL25, and BL27 may be connected to the second upper local sense amplifier LSAu2, and the twenty-second, twenty-fourth, twenty-sixth, and twenty-eighth bit lines BL22, BL24, BL26, and BL28 may be connected to the second lower local sense amplifier LSAd2. The thirty-first, thirty-third, thirty-fifth, and thirty-seventh bit lines BL31, BL33, BL35, and BL37 may be connected to the third upper local sense amplifier LSAu3, and the thirty-second, thirty-fourth, thirty-sixth, and thirty-eighth bit lines BL32, BL34, BL36, and BL38 may be connected to the third lower local sense amplifier LSAd3.

The first upper local sense amplifier LSAu1 and the first lower local sense amplifier LSAd1 may operate in response to the first column select signal CSL1, the second upper local sense amplifier LSAu2 and the second lower local sense amplifier LSAd2 may operate in response to the second column select signal CSL2, and the third upper local sense amplifier LSAu3 and the third lower local sense amplifier LSAd3 may operate in response to the third column select signal CSL3.

In an embodiment, the first to third upper local sense amplifiers LSAu1, LSAu2, and LSAu3 may be spaced apart from the plurality of memory cells in a first direction, and the first to third lower local sense amplifiers LSAd1, LSAd2, and LSAd3 may be spaced apart from the plurality of memory cells in a second direction opposite to the first direction.

The structure of the memory cell array 110 described above is a partial example, and the scope of the present disclosure is not limited thereto.

The write data DT_WR may include a bit string of 24-bits 24*b* having an order determined based on the structure of the memory cell array 110 described above, and may be stored in a plurality of memory cells of the memory cell array 110.

For example, the first to seventh data bits D1 to D7 included in the a-th sub-data DT_sa may be stored in memory cells connected to the eleventh, thirteenth, sixteenth, eighteenth, twenty-first, twenty-third, and twenty-sixth bit lines BL11, BL13, BL16, BL18, BL21, BL23, and BL26, respectively (in sequential order with reference to bit lines, this may include first, third, sixth, eighth, ninth, eleventh, and fourteenth bit lines). The first to fifth parity bits P1 to P5 included in the a-th sub-parity data PR_sa corresponding to the a-th sub-data DT_sa may be stored in memory cells connected to the twenty-eighth, thirty-first, thirty-third, thirty-sixth, and thirty-eighth bit lines BL28, BL31, BL33, BL36, and BL38, respectively (in sequential order with reference to bit lines, this may include sixteenth, seventeenth, nineteenth, twenty-second, and twenty-fourth bit lines).

The eighth to fourteenth data bits D8 to D14 included in the b-th sub-data DT_sb may be stored in memory cells connected to the twelfth, fourteenth, fifteenth, seventeenth, twenty-second, twenty-fourth, and twenty-fifth bit lines BL12, BL14, BL15, BL17, BL22, BL24, and BL25, respectively (in sequential order with reference to bit lines, this may include second, fourth, fifth, seventh, tenth, twelfth, and thirteenth bit lines). The sixth to tenth parity bits P6 to P10 included in the b-th sub-parity data PR_sb corresponding to the b-th sub-data DT_sb may be stored in memory cells connected to the twenty-seventh, thirty-second, thirty-fourth, thirty-fifth, and thirty-seventh bit lines BL27, BL32, BL34, BL35, and BL37, respectively (in sequential order with reference to bit lines, this may include fifteenth, eighteenth, twentieth, twenty-first, and twenty-third bit lines).

As described above, when the write data DT_WR is stored in the memory cells, the memory cells connected to one local sense amplifier may include two 2-bit symbols SYB, and the two 2-bit symbols SYB may respectively correspond to the a-th sub-data DT_sa and the b-th sub-data DT_sb. For example, the memory cells corresponding to the eleventh, thirteenth, fifteenth, and seventeenth bit lines BL11, BL13, BL15, and BL17 connected to the first upper local sense amplifier LSAu1 store the first, second, tenth, and eleventh data bits D1, D2, D10, and D11, respectively. In this case, the first and second data bits D1 and D2 may be a 2-bit symbol SYBa for the a-th sub-data DT_sa, and the tenth and eleventh data bits D10 and D11 may be a 2-bit symbol SYMb for the b-th sub-data DT_sb. In this case, when errors occur in the first, second, tenth, and eleventh data bits D1, D2, D10, and D11 due to a defect in the first upper local sense amplifier LSAu1, all 4-bit errors may be corrected. This is described in more detail with reference to the drawings below.

In an embodiment, as described above, the a-th sub-data DT_sa and the a-th sub-parity data PR_sa generated by the a-th ECC encoder 182a may be referred to as "a-th data code".

That is, the a-th data code may include the a-th sub-data DT_sa and the a-th sub-parity data PR_sa. The a-th data code may include a plurality of 2-bit symbols. In this case, one of the plurality of 2-bit symbols included in the a-th data code and one of the plurality of 2-bit symbols included in the b-th data code may be stored in memory cells corresponding to one local sense amplifier.

Figure 7:
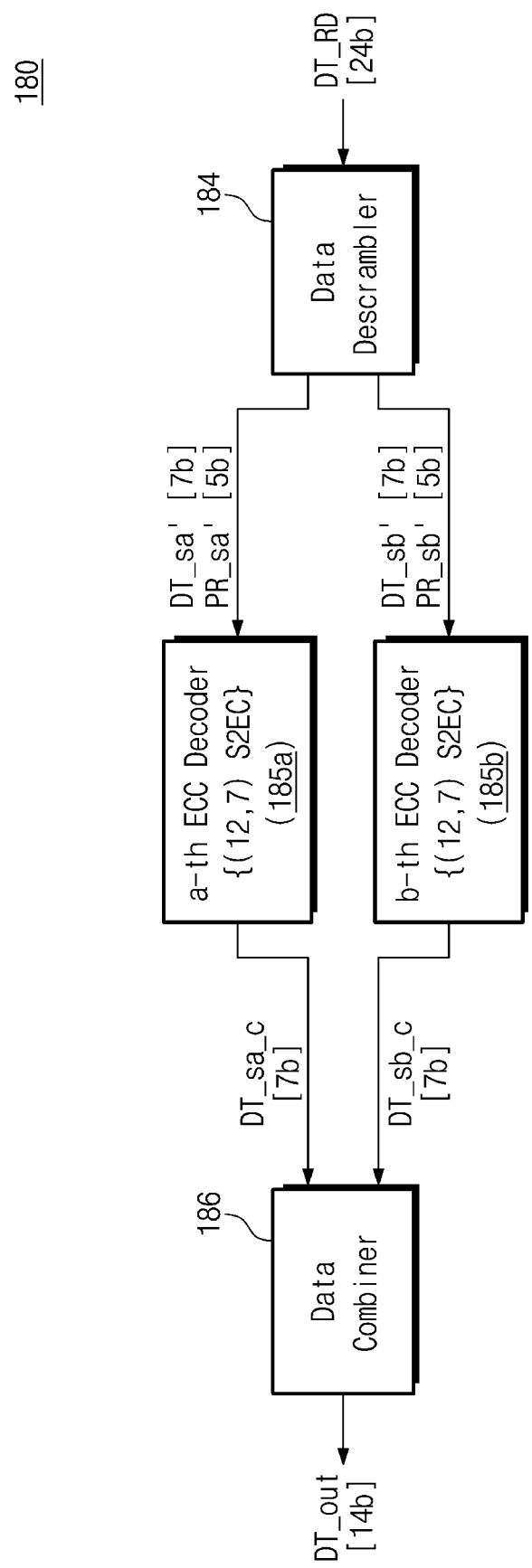
FIG. 7 is a block diagram illustrating an ECC circuit of FIG. 1 according to an embodiment.

FIG. 7 is a block diagram illustrating an ECC circuit of FIG. 1. FIGS. 1, 4, and 7, the ECC circuit 180 may further include a data descrambler 184, an a-th ECC decoder 185a, a b-th ECC decoder 185b, and a data combiner 186.

The data descrambler 184 may perform data descrambling on the read data DT_RD read from the memory cell array 110 to generate a-th sub-data DT_sa', a-th sub-parity data PR_sa', b-th sub-data DT_sb', and b-th sub-parity data PR_sb'. Each of the a-th sub-data DT_sa' and the b-th sub-data DT_sb' has a size of 7-bits 7b, and each of the a-th sub-parity data PR_sa' and the b-th sub-parity data PR_sb' has a size of 5-bits 5b. In an embodiment, the data descrambler 184 may perform data descrambling based on the structure of the memory cell array 110. In an embodiment, the a-th sub-data DT_sa' and the a-th sub-parity data PR_sa' may be included in the a-th data code, the b-th sub-data DT_sb' and the b-th sub-parity data PR_sb' may be included in the b-th data code, and the data descrambler 184 may generate the a-th data code and the b-th data code by performing a data descramble operation on the read data DT_RD. In this case, each of the a-th and b-th data codes may have a size of 12-bits.

The a-th ECC decoder 185a may generate a-th corrected sub-data DT_sa_c by performing ECC decoding based on the a-th sub-data DT_sa' and the a-th sub-parity data PR_sa'. For example, the a-th ECC decoder 185a may perform ECC decoding on the a-th sub-data DT_sa' and the a-th sub-parity data PR_sa' based on the (12,7) S2EC code. In this case, a random 1-bit error or a 2-bit symbol error may be corrected in the a-th sub-data DT_sa'. In an embodiment, the a-th sub-data DT_sa' and the a-th sub-parity data PR_sa' may be included in the a-th data code, and the a-th ECC decoder 185a may perform ECC decoding on the a-th data code to generate the a-th corrected sub-data DT_sa_c.

The b-th ECC decoder 185b may generate b-th corrected sub-data DT_sb_c by performing ECC decoding based on the b-th sub-data DT_sb' and the b-th sub-parity data PR_sb'. For example, the b-th ECC decoder 185b may perform ECC decoding on the b-th sub-data DT_sb' and the b-th sub-parity data PR_sb' based on the (12,7) S2EC code. In this case, a random 1-bit error or a 2-bit symbol error may be corrected in the b-th sub-data DT_sb'. In an embodiment, the b-th sub-data DT_sb' and the b-th sub-parity data PR_sb' may be included in the b-th data code, and the b-th ECC decoder 185b may perform ECC decoding on the b-th data code to generate the b-th corrected sub-data DT_sb_c.

The data combiner 186 may generate output data DT_out by combining the a-th corrected sub-data DT_sa_c and the b-th corrected sub-data DT_sb_c. The output data DT_out may have a size of 14-bits 14b. In an embodiment, when ECC encoding and ECC decoding by the ECC circuit 180 are normally successful, the output data DT_out may be the same as the input data DT_in.

Figure 8:
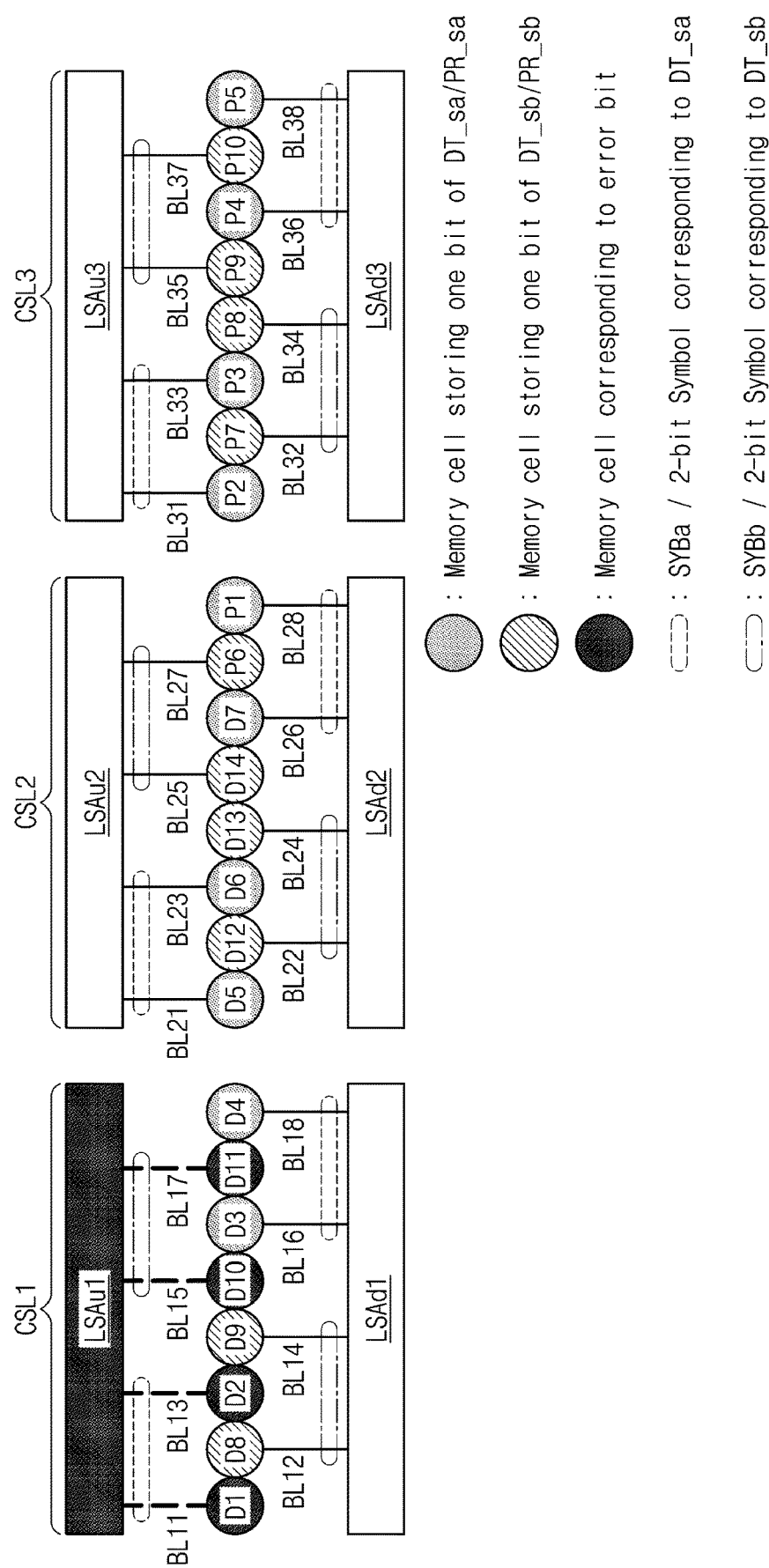
FIGS. 8 and 9 are diagrams for describing an operation of ECC decoding performed by an ECC circuit of FIG. 7.
Figure 9:
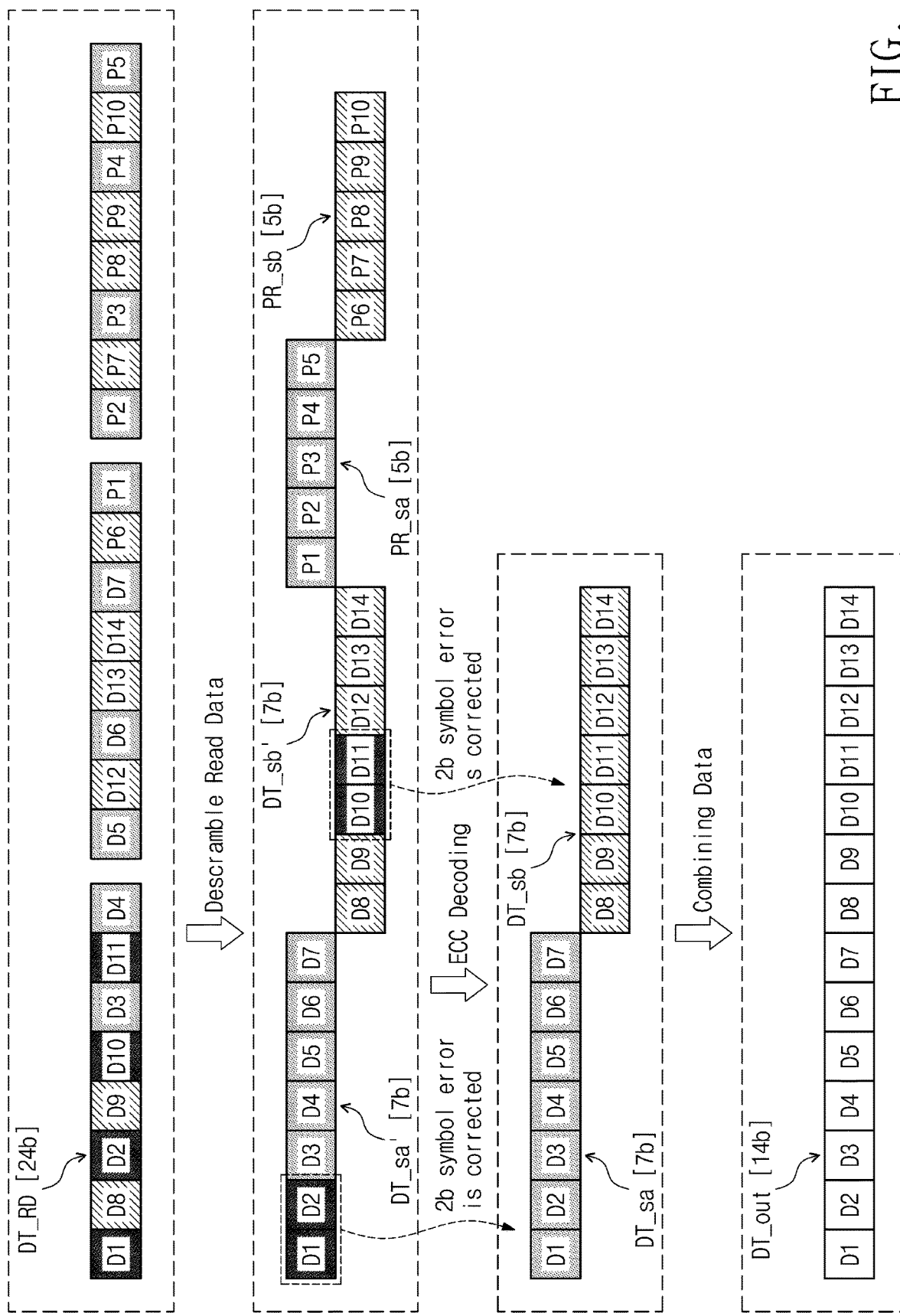

FIGS. 8 and 9 are diagrams for describing an operation (e.g., ECC decoding) of an ECC circuit of FIG. 7. For convenience of description, it is assumed that a plurality of memory cells of FIG. 8 store write data DT_WR as described with reference to FIG. 6. In addition, the configuration and connection relationship of the plurality of memory cells, the plurality of bit lines BL11 to BL18, BL21 to BL28, and BL31 to BL38, and the plurality of local sense amplifiers LSAu1 to LSAu3 and LSAd1 to LSAd3 have been described above. Therefore, additional description thereof will be omitted to avoid redundancy.

Referring to FIGS. 1, 7, 8, and 9, due to a defect in the first upper local sense amplifier LSAu1, errors may occur in the first, second, tenth, and eleventh data bits D1, D2, D10, and D11 corresponding to the eleventh, thirteenth, fifteenth, and seventeenth bit lines BL11, BL13, BL15, and BL17. That is, a specific pattern of 4-bit errors may occur. This may be referred to as a Half CSL error.

In this case, the read data DT_RD may include a bit string of 24-bits 24b as illustrated in FIG. 9. In this case, the first, second, tenth, and eleventh data bits D1, D2, D10, and D11 will include errors.

The data descrambler 184 of the ECC circuit 180 may perform data descrambling on the read data DT_RD. In this case, the first to seventh data bits D1 to D7 may be included in the a-th sub-data DT_sa', and the eighth to fourteenth data bits D8 to D14 may be included in the b-th sub-data DT_sb'. The first to fifth parity bits P1 to P5 may be included in the a-th sub-parity data PR_sa', and the sixth to tenth parity bits P6 to P10 may be included in the b-th sub-parity data PR_sb'.

Subsequently, the a-th ECC decoder 185a of the ECC circuit 180 may perform ECC decoding on the a-th sub-data DT_sa' and the a-th sub-parity data PR_sa' to generate the a-th corrected sub-data DT_sa_c. The b-th ECC decoder 185b of the ECC circuit 180 may perform ECC decoding on the b-th sub-data DT_sb' and the b-th sub-parity data PR_sb' to generate the b-th corrected sub-data DT_sb_c.

For example, as described above, due to a defect in the first upper local sense amplifier LSAu1, errors may occur in the first, second, tenth, and eleventh data bits D1, D2, D10, and D11. In this case, the first and second data bits D1 and D2 in which the error occurs are included in the a-th sub-data DT_sa', and the tenth and eleventh data bits D10 and D11 are included in the b-th sub-data DT_sb'. Since the first and second data bits D1 and D2 are the 2-bit symbol SYBa in the a-th sub-data DT_sa', the errors of the first and second data bits D1 and D2 may be corrected by ECC decoding of the a-th ECC decoder 185a. As in the above description, since the tenth and eleventh data bits D10 and D11 are the 2-bit symbol SYBb in the b-th sub-data DT_sb', the errors of the tenth and eleventh data bits D10 and D11 may be corrected by ECC decoding of the b-th ECC decoder 185b.

The a-th corrected sub-data DT_sa_c may include the first to seventh data bits D1 to D7, and the b-th corrected sub-data DT_sb_c may include the eighth to fourteenth data bits D8 to D14. Data bits included in the a-th corrected sub-data DT_sa_c and the b-th corrected sub-data DT_sb_c will not include errors.

The data combiner 186 of the ECC circuit 180 may generate the output data DT_out by combining the a-th corrected sub-data DT_sa_c and the b-th corrected sub-data DT_sb_c. The output data DT_out may include the first to fourteenth data bits D1 to D14.

As described above, the ECC circuit 180 according to an embodiment of the present disclosure may split input data into a plurality of sub-data based on the structure of the memory cell array 110, and may perform ECC decoding on each of the plurality of sub-data. Based on the structure of the memory cell array 110, the ECC circuit 180 may generate write data by performing data scrambling on a plurality of sub-data and ECC decoding results. In an embodiment, the write data may be generated or scrambled such that only one 2-bit symbol corresponding to each sub-data is stored in memory cells corresponding to one local sense amplifier.

In other words, each of the plurality of sub-data may include a plurality of 2-bit symbols. The plurality of 2-bit symbols included in one of the plurality of sub-data may be stored in memory cells corresponding to different local sense amplifiers. In this case, even if a specific pattern of errors occurs due to a defect in the specific local sense amplifier, since each of the 2-bit symbols stored in the memory cells corresponding to the specific local sense amplifier corresponds to different sub-data, the specific pattern of errors may be corrected normally.

Figure 10:
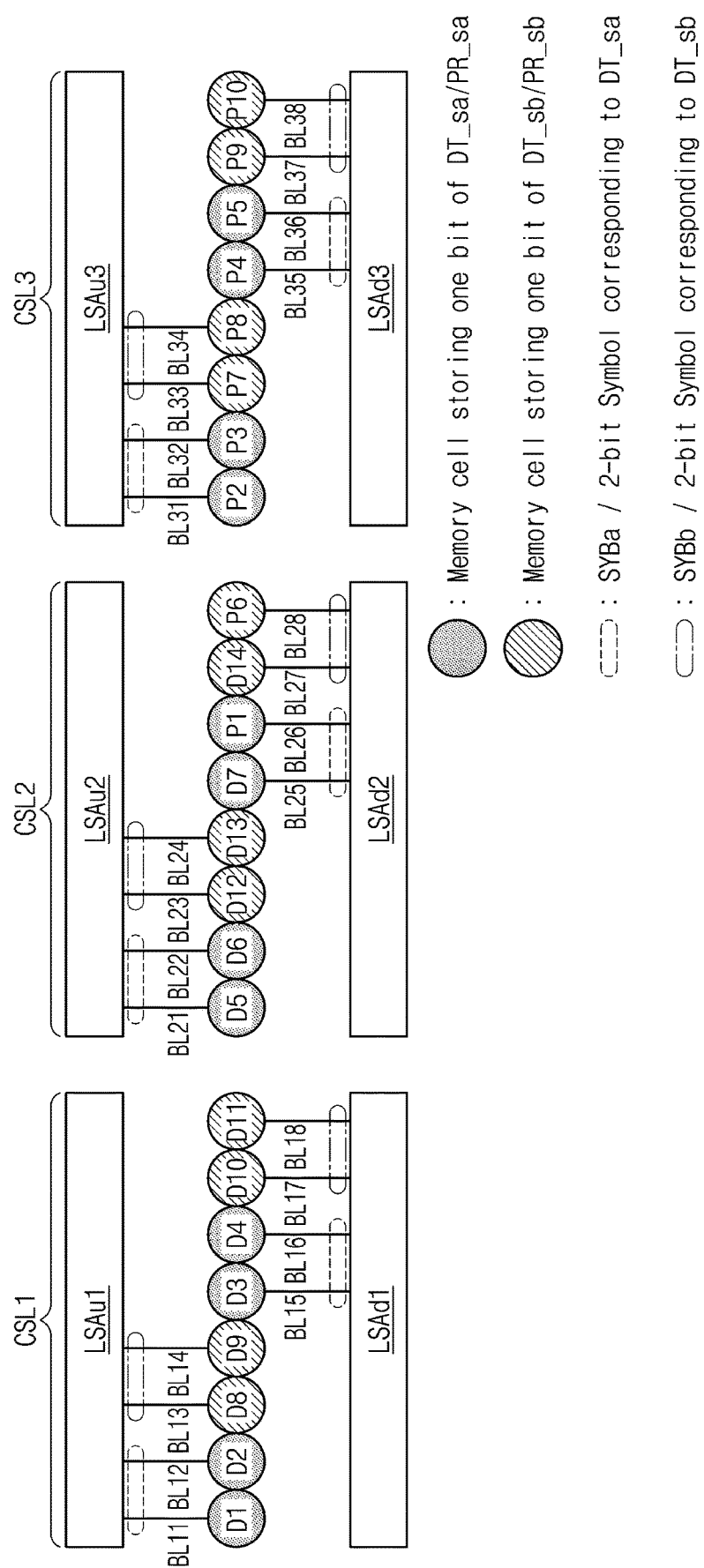
FIGS. 10 and 11 are diagrams for describing a data scrambling operation according to a structure of a memory cell array.
Figure 11:
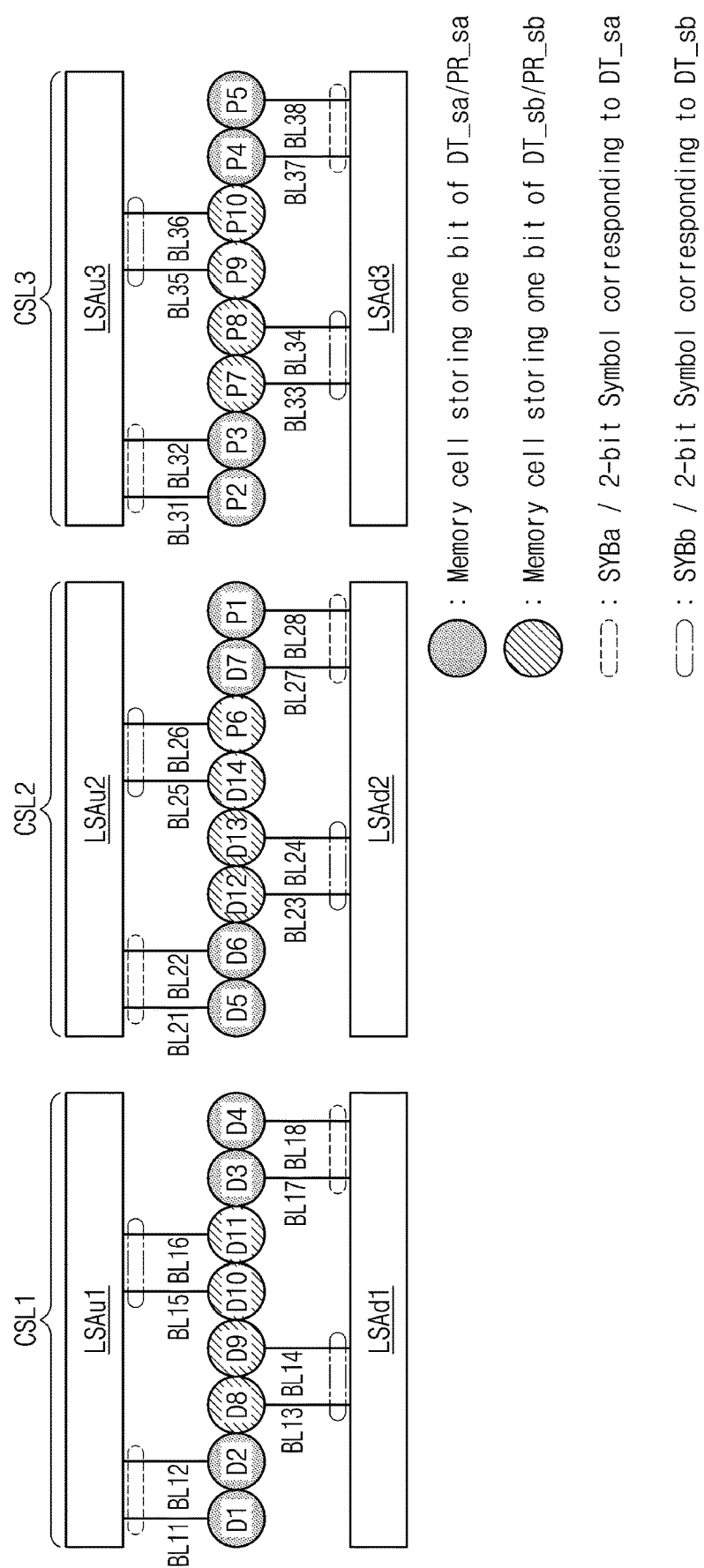

FIGS. 10 and 11 are diagrams for describing a data scrambling operation according to a structure of a memory cell array. In the above-described embodiments, the plurality of bit lines BL11 to BL18, BL21 to BL28, and BL31 to BL38 are connected to the local sense amplifiers in an even/odd scheme. However, the scope of the present disclosure is not limited thereto.

For example, as illustrated in FIG. 10, the eleventh, twelfth, thirteenth, and fourteenth bit lines BL11, BL12, BL13, and BL14 may be connected to the first upper local sense amplifier LSAu1, and the fifteenth, sixteenth, seventeenth, and eighteenth bit lines BL15, BL16, BL17, and BL18 may be connected to the first lower local sense amplifier LSAd1. The twenty-first, twenty-second, twenty-third, and twenty-fourth bit lines BL21, BL22, BL23, and BL24 may be connected to the second upper local sense amplifier LSAu2, and the twenty-fifth, twenty-sixth, twenty-seventh, and twenty-eighth bit lines BL25, BL26, BL27, and BL28 may be connected to the second lower local sense amplifier LSAd2. The thirty-first, thirty-second, thirty-third, and thirty-fourth bit lines BL31, BL32, BL33, and BL34 may be connected to the third upper local sense amplifier LSAu3, and the thirty-fifth, thirty-sixth, thirty-seventh, and thirty-eighth bit lines BL35, BL36, BL37, and BL38 may be connected to the third lower local sense amplifier LSAd3.

In this case, the write data DT_WR may be generated such that the first, second, eighth, ninth, third, fourth, tenth, and eleventh data bits D1, D2, D8, D9, D3, D4, D10, and D11 are stored in memory cells connected to the eleventh to eighteenth bit lines BL11 to BL18, respectively, the fifth, sixth, twelfth, and thirteenth data bits D5, D6, D12, and D13, the seventh data bit D7, the first parity bit P1, the fourteenth data bit D14, and the sixth parity bit P6 are stored in memory cells connected to the twenty-first to twenty-eighth bit lines BL21 to BL28, respectively, and the second, third, seventh, eighth, fourth, fifth, ninth, and tenth parity bits P2, P3, P7, P8, P4, P5, P9, and P10 are stored in memory cells connected to the thirty-first to thirty-eighth bit lines BL31 to BL38, respectively.

In this case, data bits corresponding to bit lines connected to one local sense amplifier will include 2-bit symbols corresponding to different sub-data. For example, the first and second data bits D1 and D2 among the first, second, eighth, and ninth data bits D1, D2, D8, and D9 corresponding to the first upper local sense amplifier LSAu1 are the 2-bit symbol SYBa with respect to the a-th sub-data DT_sa, and the eighth and ninth data bits D8 and D9 are the 2-bit symbol SYBb with respect to the b-th sub-data DT_sb. In detail, as in the above description, due to a defect in the first upper local sense amplifier LSAu1, even if errors occur in the first, second, eighth, and ninth data bits D1, D2, D8, and D9, the errors may be normally corrected.

Alternatively, as illustrated in FIG. 11, the eleventh, twelfth, fifteenth, and sixteenth bit lines BL11, BL12, BL15, and BL16 may be connected to the first upper local sense amplifier LSAu1, and the thirteenth, fourteenth, seventeenth, and eighteenth bit lines BL13, BL14, BL17, and BL18 may be connected to the first lower local sense amplifier LSAd1. The twenty-first, twenty-second, twenty-fifth, and twenty-sixth bit lines BL21, BL22, BL25, and BL26 may be connected to the second upper local sense amplifier LSAu2, and the twenty-third, twenty-fourth, twenty-seventh, and twenty-eighth bit lines BL23, BL24, BL27, and BL28 may be connected to the second lower local sense amplifier LSAd2. The thirty-first, thirty-second, thirty-fifth, and thirty-sixth bit lines BL31, BL32, BL35, and BL36 may be connected to the third upper local sense amplifier LSAu3, and the thirty-third, thirty-fourth, thirty-seventh, thirty-eighth bit lines BL33, BL34, BL37, and BL38 may be connected to the third lower local sense amplifier LSAd3.

In this case, the write data DT_WR may be generated such that the first, second, eighth, ninth, tenth, eleventh, third, and fourth data bits D1, D2, D8, D9, D10, D11, D3, and D4 are stored in memory cells connected to the eleventh to eighteenth bit lines BL11 to BL18, respectively, the fifth, sixth, twelfth, thirteenth, and fourteenth data bits D5, D6, D12, D13, and D14, the sixth parity bit P6, the seventh data bit D7, and the first parity bit P1 are stored in memory cells connected to the twenty-first to twenty-eighth bit lines BL21 to BL28, respectively, and the second, third, seventh, eighth, ninth, tenth, fourth, and fifth parity bits P2, P3, P7, P8, P9, P10, P4, and P5 are stored in memory cells connected to the thirty-first to thirty-eighth bit lines BL31 to BL38, respectively.

In this case, data bits corresponding to bit lines connected to one local sense amplifier will include 2-bit symbols corresponding to different sub-data. For example, the first and second data bits D1 and D2 among the first, second, tenth, and eleventh data bits D1, D2, D10, and D11 corresponding to the first upper local sense amplifier LSAu1 are the 2-bit symbol SYBa with respect to the a-th sub-data DT_sa, and the tenth and eleventh data bits D10 and D11 are the 2-bit symbol SYBb with respect to the b-th sub-data DT_sb. In detail, as in the above description, due to a defect in the first upper local sense amplifier LSAu1, even if errors occur in the first, second, tenth, and eleventh data bits D1, D2, D10, and D11, the errors may be normally corrected.

Figure 12:
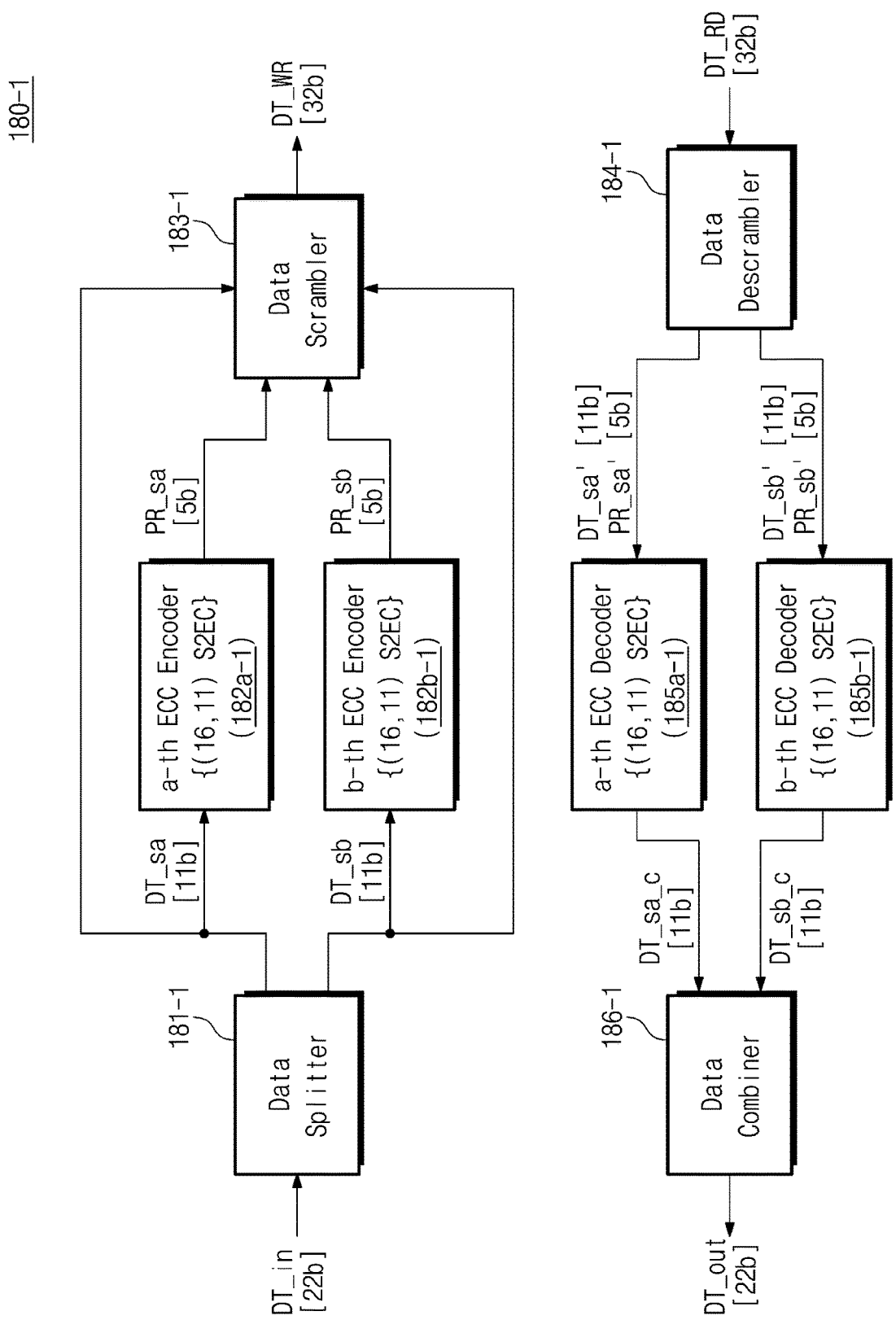
FIG. 12 is a block diagram illustrating an ECC circuit of FIG. 1 according to an embodiment.
Figure 13:
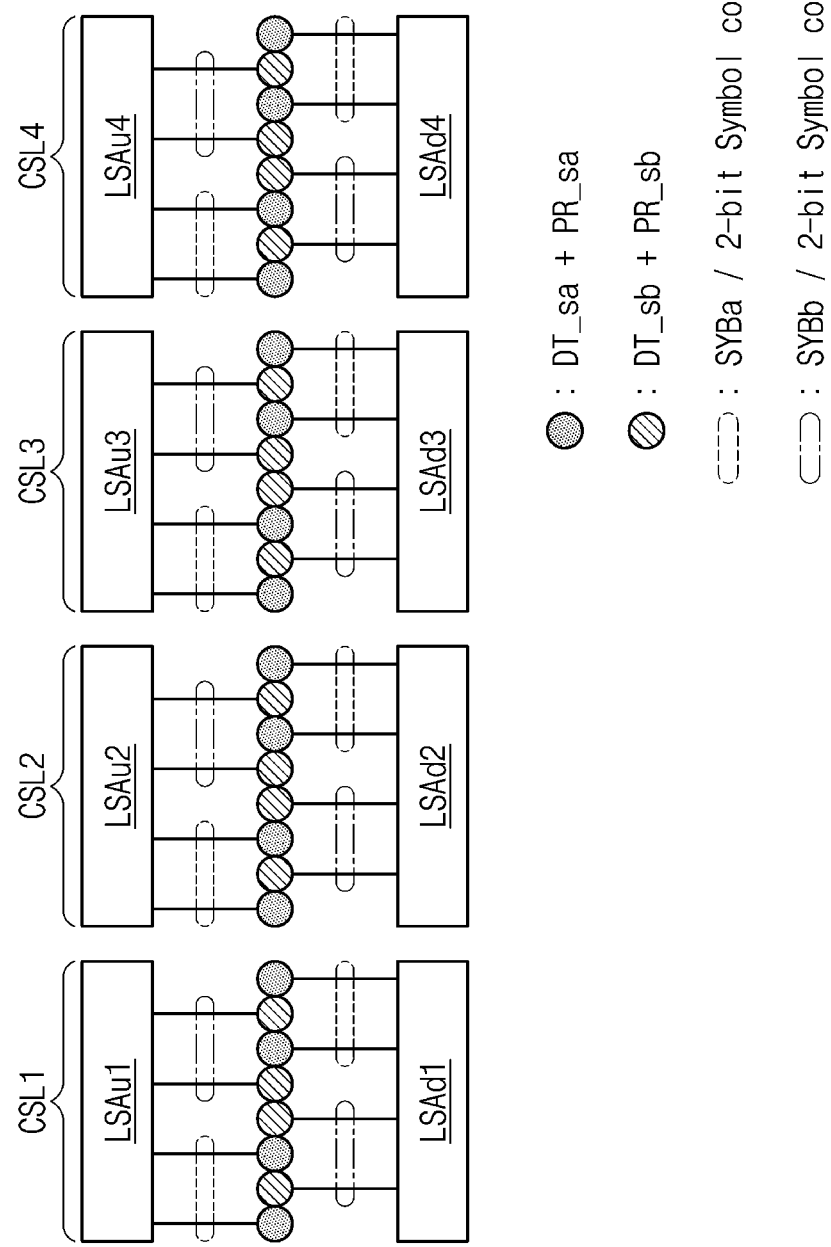
FIG. 13 is a diagram for describing an operation of storing write data generated by an ECC circuit of FIG. 12 in a memory cell array according to an embodiment.

FIG. 12 is a block diagram illustrating an ECC circuit of FIG. 1. FIG. 13 is a diagram for describing how write data generated by an ECC circuit of FIG. 12 is stored in a memory cell array. For convenience of description, additional descriptions of components similar to those described above will be omitted to avoid redundancy.

Referring to FIGS. 1, 12, and 13, an ECC circuit 180-1 may include a data splitter 181-1, an a-th ECC encoder 182a-1, a b-th ECC encoder 182b-1, a data scrambler 183-1, a data descrambler 184-1, an a-th ECC decoder 185a-1, a b-th ECC decoder 185b-1, and a data combiner 186-1.

The data splitter 181-1 may split the input data DT_in into the a-th sub-data DT_sa and the b-th sub-data DT_sb. In an embodiment of FIG. 12, the input data DT_in may have a size of 22-bits 22b, and each of the a-th sub-data DT_sa and the b-th sub-data DT_sb may have a size of 11-bits 11b.

The a-th ECC encoder 182a-1 may generate the a-th sub-parity data PR_sa by performing ECC encoding on the a-th sub-data DT_sa. For example, the a-th ECC encoder 182a-1 may perform ECC encoding on the a-th sub-data DT_sa based on the (16,11) S2EC code to generate the a-th sub-parity data PR_sa. In this case, the a-th sub-parity data PR_sa has a size of 5-bits 5b.

The b-th ECC encoder 182b-1 may generate b-th sub-parity data PR_sb by performing ECC encoding on the b-th sub-data DT_sb. For example, the b-th ECC encoder 182b-1 may generate the b-th sub-parity data PR_sb by performing ECC encoding on the b-th sub-data DT_sb based on the (16,11) S2EC code. In this case, the b-th sub-parity data PR_sb has a size of 5-bits 5b.

The data scrambler 183-1 may perform a data scrambling operation on the a-th sub-data DT_sa, the b-th sub-data DT_sb, the a-th sub-parity data PR_sa, and the b-th sub-parity data Pr_sb to generate the write data DT_WR. In an embodiment, the write data DT_WR may have a size of 32-bits 32b.

An operation of the data scrambler 183-1 of FIG. 12 may be similar to that of the data scrambler 183 described above, except for the fact that the size of scrambled data is different. In detail, the data scrambler 183-1 may perform a data scramble operation based on the structure of the memory cell array 110.

For example, when the write data DT_WR has a size of 32-bits 32b, as illustrated in FIG. 13, the write data DT_WR may be stored in 32 memory cells. In this case, as the write data DT_WR, the 2-bit symbols corresponding to different sub-data may be stored in memory cells corresponding to each of the plurality of local sense amplifiers LSAu1 to LSAu4 and LSAd1 to LSAd4. In detail, in memory cells corresponding to the first upper local sense amplifier LSAu1, one of the 2-bit symbols SYBa included in the a-th sub-data DT_sa and one of the 2-bit symbols SYBb included in the b-th sub-data Dt_sb are stored. As in the above description, one of the 2-bit symbols SYBa included in the a-th sub-data DT_sa and one of the 2-bit symbols SYBb included in the b-th sub-data DT_sb are stored in memory cells corresponding to each of the other local sense amplifiers LSAu2 to LSAu4 and LSAd1 to LSAd4. In this case, as described above, even if an error of a specific pattern occurs due to a defect in the first upper local sense amplifier LSAu1, the error may be normally corrected.

For example, referring back to FIG. 12, the data descrambler 184-1 may perform a data descramble operation on the read data DT_RD to generate the a-th sub-data DT_sa', the a-th sub-parity data PR_sa', the b-th sub-data DT_sb', and the b-th sub-parity data PR_sb'. For example, the data descrambler 184-1 may perform a data descramble operation on the read data DT_RD based on the structure of the memory cell array 110. In an embodiment, the read data DT_RD may have a size of 32-bits 32b, the a-th sub-data DT_sa' may have a size of 11-bits 11b, the a-th sub-parity data PR_sa' may have a size of 5-bits 5b, the b-th sub-data DT_sb' may have a size of 11-bits 11b, and the b-th sub-parity data PR_sb' may have a size of 5-bits 5b.

The a-th ECC decoder 185a-1 may perform ECC decoding on the a-th sub-data DT_sa' and the a-th sub-parity data PR_sa'. For example, the a-th ECC decoder 185a-1 may perform ECC decoding on the a-th sub-data DT_sa' and the a-th sub-parity data PR_sa' based on the (16, 11) S2EC code to generate the a-th corrected sub-data DT_sa_c. Accordingly, a 1-bit random error or a 2-bit symbol error of the a-th sub-data DT_sa' may be corrected by ECC decoding of the a-th ECC decoder 185a-1. In an embodiment, the a-th corrected sub-data DT_sa_c may have a size of 11-bits 11b.

The b-th ECC decoder 185b-1 may perform ECC decoding on the b-th sub-data DT_sb' and the b-th sub-parity data PR_sb'. For example, the b-th ECC decoder 185b-1 may perform ECC decoding on the b-th sub-data DT_sb' and the b-th sub-parity data PR_sb' based on the (16, 11) S2EC code to generate the b-th corrected sub-data DT_sb_c. Accordingly, a 1-bit random error or a 2-bit symbol error of the b-th sub-data DT_sb' may be corrected by ECC decoding of the b-th ECC decoder 185b-1. In an embodiment, the b-th corrected sub-data DT_sb_c may have a size of 11-bits 11b.

The data combiner 186-1 may generate the output data DT_out by combining the a-th corrected sub-data DT_sa_c and the b-th corrected sub-data DT_sb_c. In an embodiment, the output data DT_out may have a size of 24-bits 24b.

In an embodiment, since an operation of the ECC circuit 180-1 of FIG. 12 is similar to that of the ECC circuit 180 described with reference to FIGS. 1 to 11 except for the fact that the number of bits of data to be processed is different, additional description thereof will be omitted to avoid redundancy. In detail, the ECC circuit 180-1 of FIG. 12 may split the input data DT_in into a plurality of sub-data based on the structure of the memory cell array 110, may perform ECC encoding on each of the split sub-data, and may perform a data scrambling operation based on the structure of the memory cell array 110. In this case, 2-bit symbols of different sub-data may be stored in memory cells corresponding to one local sense amplifier. Accordingly, an error of a specific pattern may be normally corrected.

Figure 14:
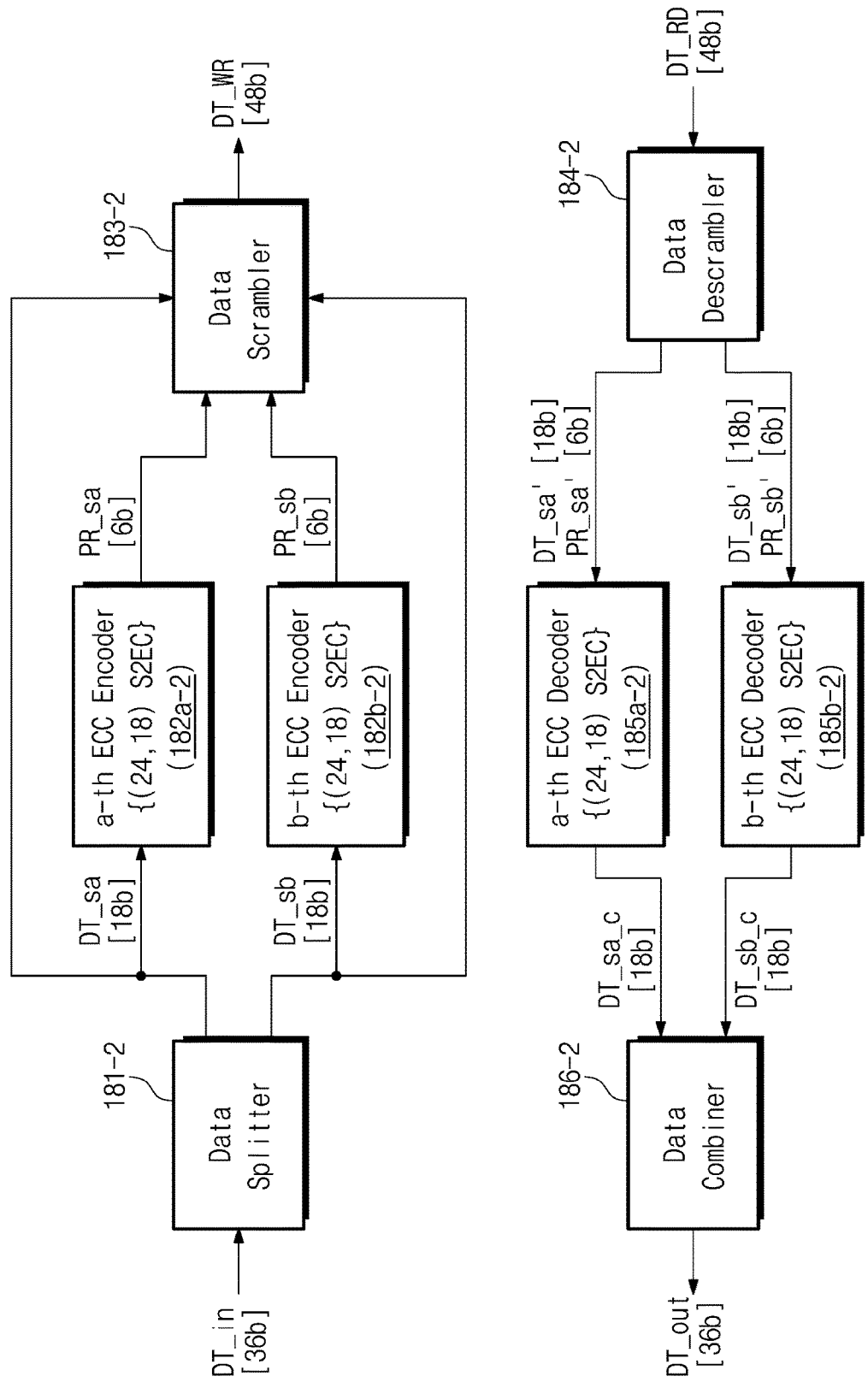
FIG. 14 is a block diagram illustrating an ECC circuit of FIG. 1 according to an embodiment.
Figure 15:
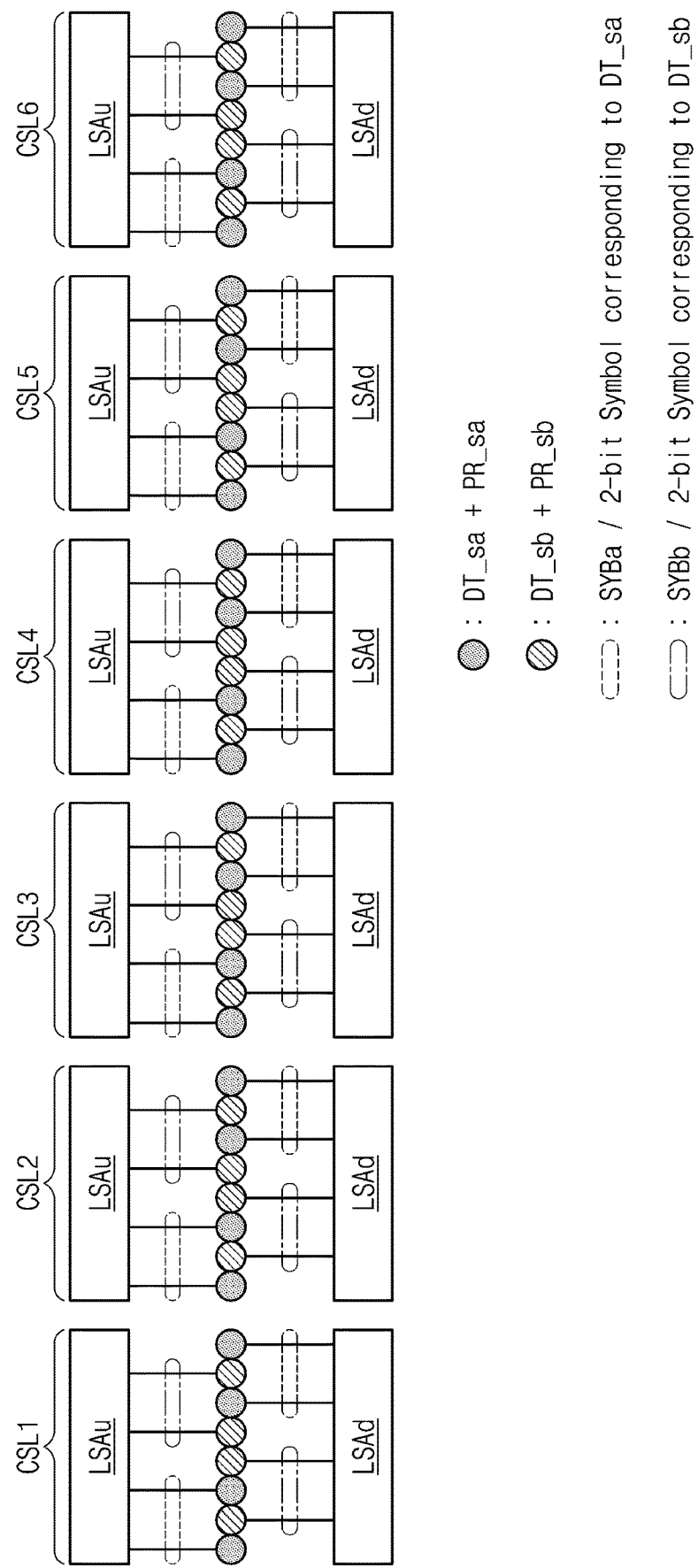
FIG. 15 is a diagram for describing an operation of storing write data generated by an ECC circuit of FIG. 14 in a memory cell array according to an embodiment.

FIG. 14 is a block diagram illustrating an ECC circuit of FIG. 1. FIG. 15 is a diagram for describing how write data generated by an ECC circuit of FIG. 14 is stored in a memory cell array. For convenience of description, additional descriptions of components similar to those described above will be omitted to avoid redundancy.

Referring to FIGS. 1, 14, and 15, an ECC circuit 180-2 may include a data splitter 181-2, an a-th ECC encoder 182a-2, a b-th ECC encoder 182b-2, a data scrambler 183-2, a data descrambler 184-2, an a-th ECC decoder 185a-2, a b-th ECC decoder 185b-2, and a data combiner 186-2.

In an embodiment of FIG. 14, except for the fact that the input data DT_in and the output data DT_out have a size of 36-bits 36b, the write data DT_WR and the read data DT_RD have a size of 48-bits 48b, and the a-th ECC encoder 182a-2, the b-th ECC encoder 182b-2, the a-th ECC decoder 185a-2, and the b-th ECC decoder 185b-2 perform ECC encoding and ECC decoding based on a (24,18) S2EC code, the ECC circuit 180-2 is similar to the ECC circuit 180-1 described with reference to FIG. 12, so additional description thereof will be omitted to avoid redundancy.

In an embodiment, the write data DT_WR has a size of 48-bits 48b, and thus, each bit of the write data DT_WR will be stored in 48 memory cells. In this case, as illustrated in FIG. 15, the write data DT_WR may be stored in the 48 memory cells such that 2-bit symbols corresponding to different sub-data may be stored in memory cells corresponding to each of the plurality of local sense amplifiers LSAu and LSAd. In detail, one of the 2-bit symbols SYBa included in the a-th sub-data DT_sa and one of the 2-bit symbols SYBb included in the b-th sub-data DT_sb are stored in memory cells corresponding to each of the local sense amplifiers LSAu and LSAd. In this case, as described above, even if an error of a specific pattern occurs due to a defect in the first upper local sense amplifier LSAu1, the error may be normally corrected.

Figure 16:
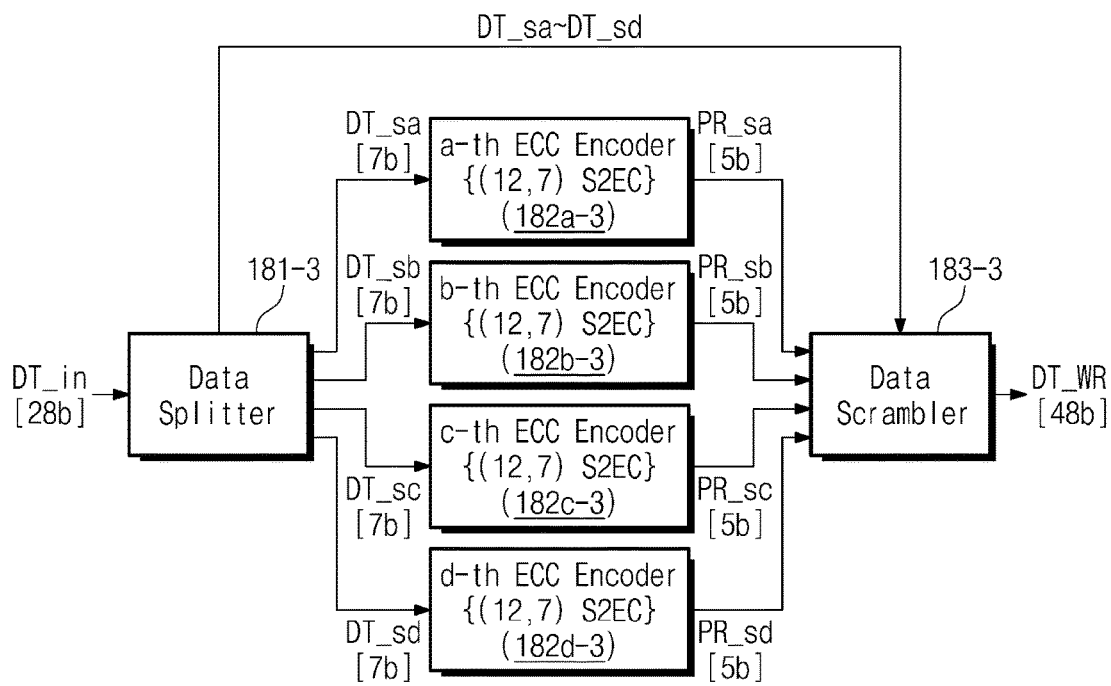
FIG. 16 is a block diagram illustrating an ECC circuit of FIG. 1 according to an embodiment.
Figure 16:
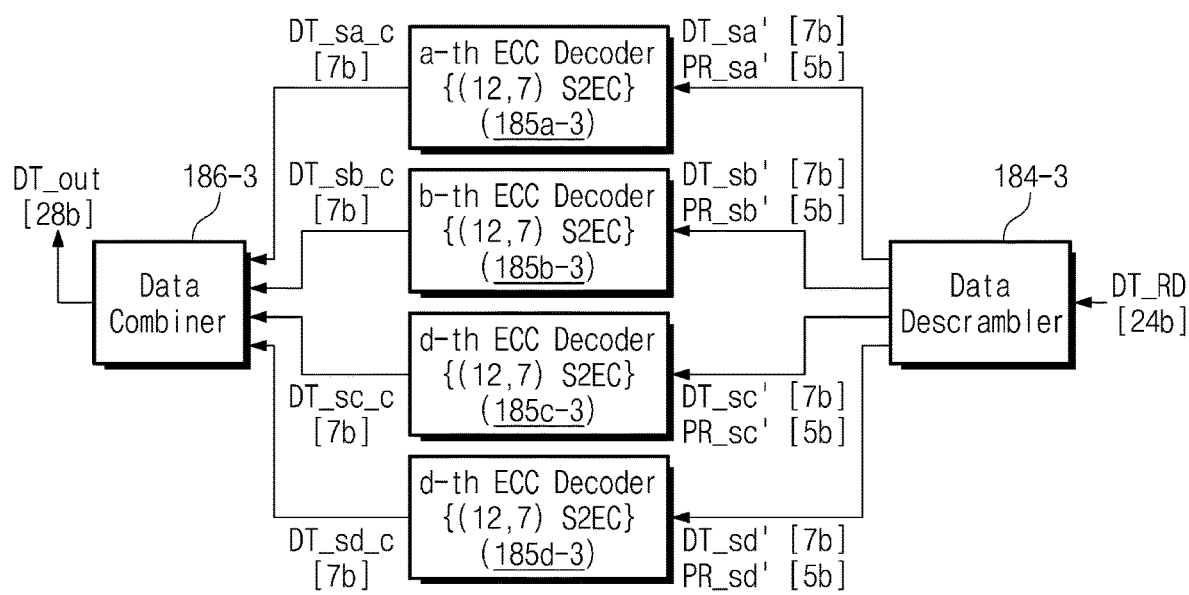

FIG. 16 is a block diagram illustrating an ECC circuit of FIG. 1. Referring to FIGS. 1 and 16, an ECC circuit 180-3 may include a data splitter 181-3, an a-th ECC encoder 182a-3, a b-th ECC encoder 182b-3, a c-th ECC encoder 182c-3, a d-th ECC encoder 182d-3, a data scrambler 183-3, a data descrambler 184-3, an a-th ECC decoder 185a-3, a b-th ECC decoder 185b-3, a c-th ECC decoder 185c-3, a d-th ECC decoder 185d-3, and a data combiner 186-3.

The data splitter 181-3 may split the input data DT_in into the a-th sub-data DT_sa, the b-th sub-data DT_sb, c-th sub-data DT_sc, and d-th sub-data DT_sd. In an embodiment, the input data DT_in may have a size of 28-bits 28b. Each of the a-th sub-data DT_sa, the b-th sub-data DT_sb, the c-th sub-data DT_sc, and the d-th sub-data DT_sd may have a size of 7-bits 7b.

The a-th ECC encoder 182a-3 may perform ECC encoding on the a-th sub-data DT_sa. For example, the a-th ECC encoder 182a-3 may perform ECC encoding on the a-th sub-data DT_sa based on the (12,7) S2EC code to generate the a-th sub-parity data PR_sa. The b-th ECC encoder 182b-3 may perform ECC encoding on the b-th sub-data DT_sb. For example, the b-th ECC encoder 182b-3 may perform ECC encoding on the b-th sub-data DT_sb based on the (12,7) S2EC code to generate the b-th sub-parity data PR_sb. The c-th ECC encoder 182c-3 may perform ECC encoding on the c-th sub-data DT_sc. For example, the c-th ECC encoder 182c-3 may perform ECC encoding on the c-th sub-data DT_sc based on the (12,7) S2EC code to generate c-th sub-parity data PR_sc. The d-th ECC encoder 182d-3 may perform ECC encoding on the d-th sub-data DT_sd. For example, the d-th ECC encoder 182d-3 may perform ECC encoding on the d-th sub-data DT_sd based on the (12,7) S2EC code to generate d-th sub-parity data PR_sd. In an embodiment, each of the a-th to d-th sub-parity data PR_sa to PR_sd may have a size of 5-bits 5b.

The data scrambler 183-3 may perform a data scrambling operation on the a-th to d-th sub-data DT_sa to DT_sd and the a-th to d-th sub-parity data PR_sa to PR_sd. For example, the data scrambler 183-3 may generate the write data DT_WR by performing a data scramble operation based on the structure of the memory cell array 110. The write data DT_WR may have a size of 48-bits 48b.

In an embodiment, the write data DT_WR may be generated such that 2-bit symbols corresponding to different sub-data are stored in memory cells corresponding to one local sense amplifier, similar to the above description. This will be described in more detail with reference to FIGS. 17 and 18.

The data descrambler 184-3 may perform a data descramble operation on the read data DT_RD. For example, the data descrambler 184-3 may perform a data descramble operation on the read data DT_RD based on the structure of the memory cell array 110 to generate the a-th sub-data DT_sa', the b-th sub-data DT_sb', c-th sub-data DT_sc', d-th sub-data DT_sd', the a-th sub-parity data PR_sa', the b-th sub-parity data PR_sb', c-th sub-parity data PR_sc', and d-th sub-parity data PR_sd'. Each of the a-th sub-data DT_sa', the b-th sub-data DT_sb', the c-th sub-data DT_sc', and the d-th sub-data DT_sd' may have a size of 7-bits 7b, and each of the a-th sub-parity data PR_sa', the b-th sub-parity data PR_sb', the c-th sub-parity data PR_sc', and the d-th sub-parity data PR_sd' may have a size of 5-bits (5b).

The a-th ECC decoder 185a-3 may perform ECC decoding on the a-th sub-data DT_sa' and the a-th sub-parity data PR_sa'. For example, the a-th ECC decoder 185a-3 may generate the a-th corrected sub-data DT_sa_c by performing ECC decoding based on the (12,7) S2EC code. The b-th ECC decoder 185b-3 may perform ECC decoding on the b-th sub-data DT_sb' and the b-th sub-parity data PR_sb'. For example, the b-th ECC decoder 185b-3 may generate the b-th corrected sub-data DT_sb_c by performing ECC decoding based on the (12,7) S2EC code. The c-th ECC decoder 185c-3 may perform ECC decoding on the c-th sub-data DT_sc' and the c-th sub-parity data PR_sc'. For example, the c-th ECC decoder 185c-3 may generate c-th corrected sub-data DT_sc_c by performing ECC decoding based on the (12,7) S2EC code. The d-th ECC decoder 185d-3 may perform ECC decoding on the d-th sub-data DT_sd' and the d-th sub-parity data PR_sd'. For example, the d-th ECC decoder 185d-3 may generate d-th corrected sub-data DT_sd_c by performing ECC decoding based on the (12,7) S2EC code.

The data combiner 186-3 may combine the a-th to d-th corrected sub-data DT_sa_c, DT_sb_c, DT_sc_c, and DT_sd_c to output the output data DT_out. In an embodiment, the output data DT_out may have a size of 28-bits 28b.

As described above, the ECC circuit 180-3 may split the input data DT_in into the four sub-data DT_sa, DT_sb, DT_sc, and DT_sd, and may perform ECC encoding on each of the four sub-data DT_sa, DT_sb, DT_sc, and DT_sd. Subsequently, the write data DT_WR generated through the data scrambling operation may be stored in the memory cell array 110. In this case, a specific pattern error due to a defect in the local sense amplifier or other factors may be normally corrected.

Figure 17:
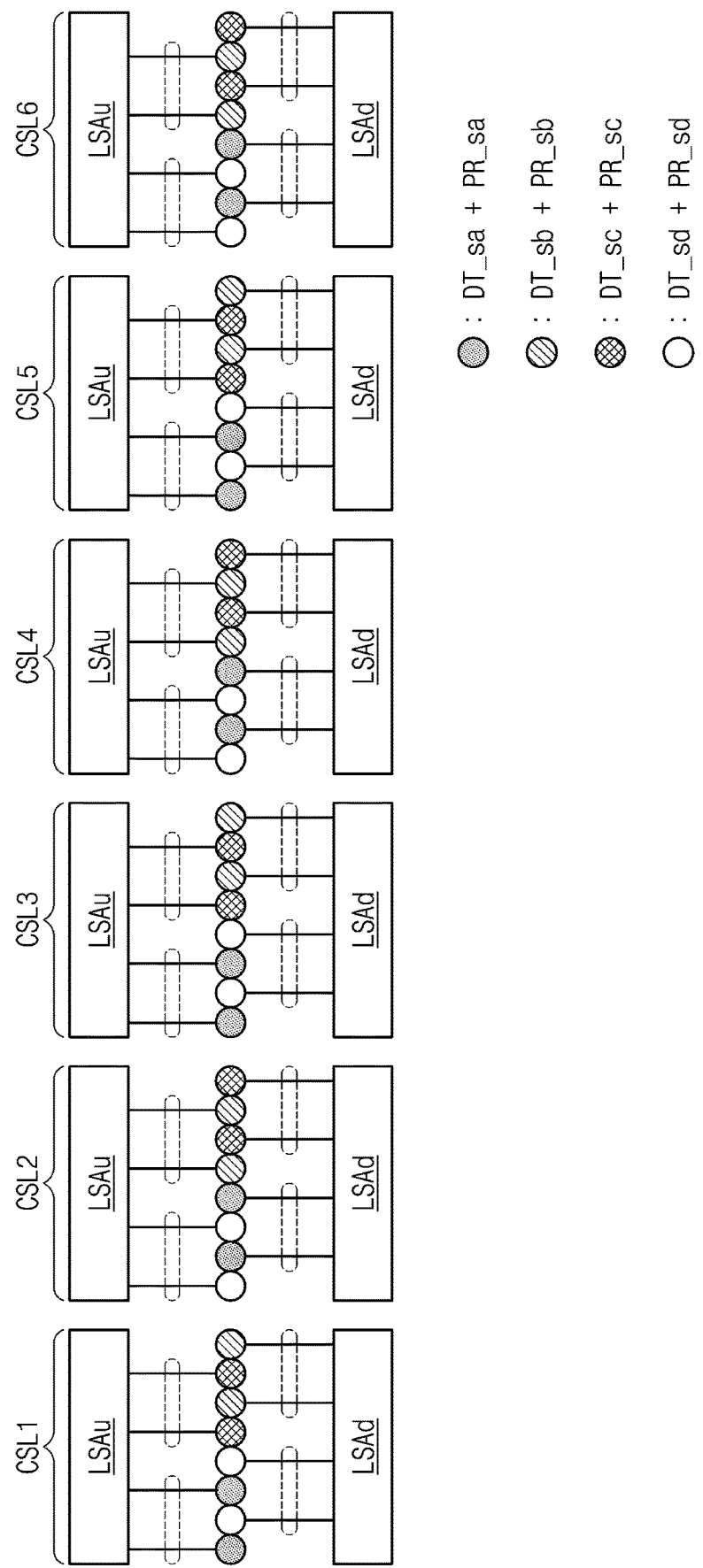
FIGS. 17 and 18 are diagrams illustrating various configurations of a memory cell array in which write data generated by an ECC circuit of FIG. 16 is stored according to some embodiments.
Figure 18:
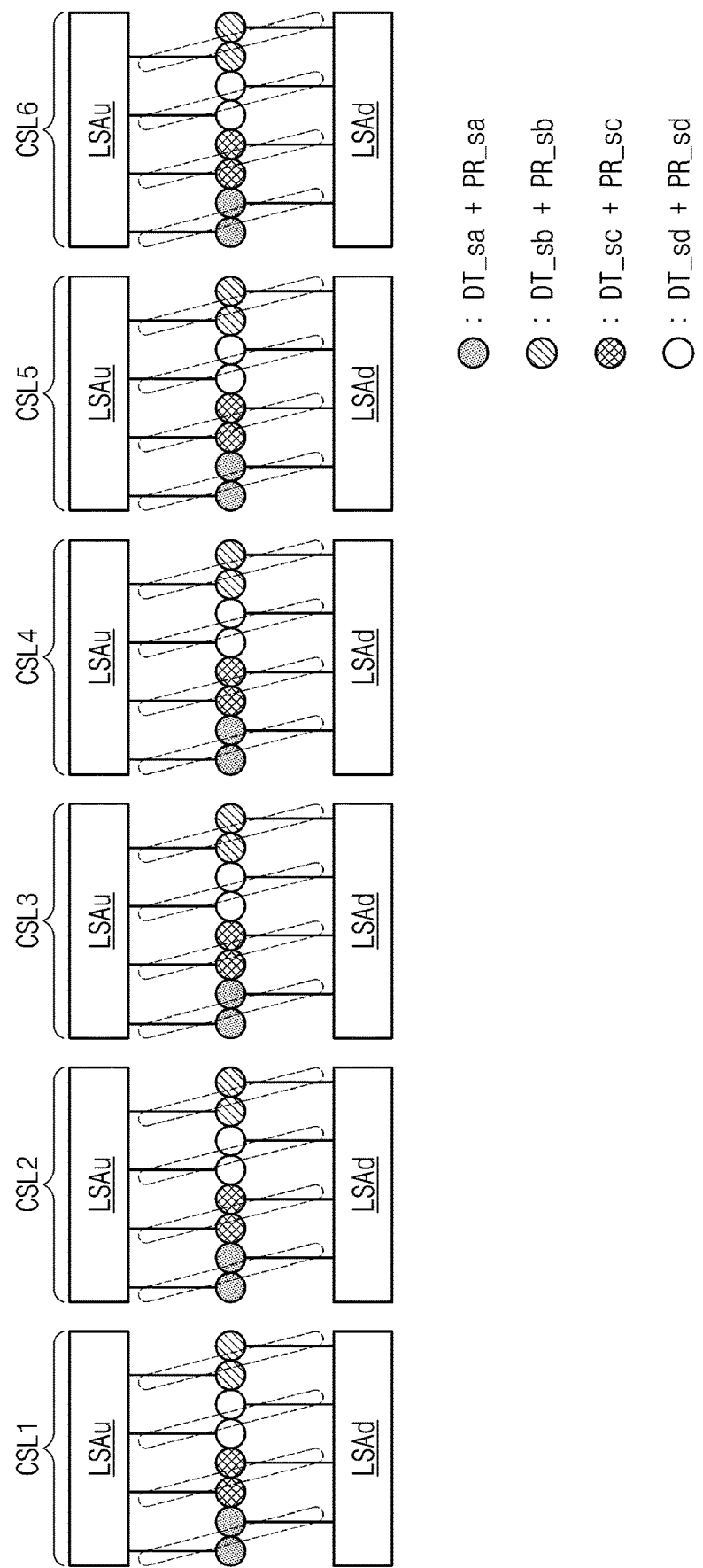

FIGS. 17 and 18 are diagrams illustrating a configuration of a memory cell array in which write data generated by an ECC circuit of FIG. 16 is stored. For convenience of description, additional descriptions of unnecessary and redundant components will be omitted to avoid redundancy.

First, referring to FIGS. 1, 16, and 17, the write data DT_WR may have a size of 48-bits 48*b*. In detail, the write data DT_WR may be stored in 48 memory cells connected to the same word line. In this case, as illustrated in FIG. 17, the plurality of local sense amplifiers LSAu and LSAd are connected to a plurality of bit lines, respectively. In this case, the memory cells corresponding to each of the plurality of local sense amplifiers LSAu and LSAd store 2-bit symbols included in different sub-data. For example, the memory cells corresponding to the upper local sense amplifier LSAu operating in response to the first column select signal CSL1 store the 2-bit symbol corresponding to the a-th sub-data DT_sa and the 2-bit symbol corresponding to the c-th sub-data DT_sc. The memory cells corresponding to the lower local sense amplifier LSAd operating in response to the first column select signal CSL1 store the 2-bit symbol corresponding to the b-th sub-data DT_sb and the 2-bit symbol corresponding to the d-th sub-data DT_sd.

Accordingly, even if an error occurs in corresponding data bits due to a defect in the upper local sense amplifier LSAu operating in response to the first column select signal CSL1, the error may be normally corrected. Alternatively, even if an error occurs in the corresponding data bits due to a defect in the upper local sense amplifier LSAu and the lower local sense amplifier LSAd operating in response to the first column select signal CSL1 (i.e., when an error occurs in all memory cells corresponding to the first column select signal CSL1; when 8-bit error occurs), the error may be corrected normally.

Next, referring to FIGS. 1, 16, and 18, the plurality of local sense amplifiers LSAu and LSAd are connected to a plurality of bit lines, respectively. In this case, the memory cells corresponding to each of the plurality of local sense amplifiers LSAu and LSAd are configured to store one data bit or one parity bit included in different sub-data. For example, the memory cells corresponding to the upper local sense amplifier LSAu configured to operate in response to the first column select signal CSL1 store one of the bits of the a-th sub-data DT_sa, one of the bits of the b-th sub-data DT_sb, one of the bits of the c-th sub-data DT_sc, and one of the bits of the d-th sub-data DT_sd. The memory cells corresponding to the lower local sense amplifier LSAd configured to operate in response to the first column select signal CSL1 store another one of the bits of the a-th sub-data DT_sa, another one of the bits of the b-th sub-data DT_sb, another one of the bits of the c-th sub-data DT_sc, and another one of the bits of the d-th sub-data DT_sd.

In this case, even if a specific pattern of error (i.e., 4-bit error) due to a defect in one local sense amplifier occurs or a specific pattern of error (i.e., 8-bit error) due to a defect in local sense amplifiers operating in response to the same column select signal (e.g., CSL1) occurs, the error may be normally corrected. For example, it is assumed that 4-bit errors occur due to a defect in the upper local sense amplifier LSAu operating in response to the first column select signal CSL1. In this case, the 4-bit errors correspond to the a-th to d-th sub-data DT_sa to DT_sd, respectively. That is, the 4-bit errors may be a 1-bit random error with respect to the a-th to d-th sub-data DT_sa to DT_sd, respectively. Therefore, the 4-bit errors may be corrected by the a-th to d-th ECC decoders 185*a*-3 to 185*d*-3.

Alternatively, 8-bit errors may occur due to defects in the upper local sense amplifier LSAu and the lower local sense amplifier LSAd, which operate in response to the first column select signal CSL1. In this case, the 8-bit errors may be a 2-bit symbol error with respect to the a-th to d-th sub-data DT_sa to DT_sd, respectively. Therefore, the 8-bit errors may be corrected by the a-th to d-th ECC decoders 185*a*-3 to 185*d*-3.

As described above, according to embodiments of the present disclosure, the ECC circuit 180 may be configured to correct an error of a specific pattern due to structural characteristics of the memory cell array 110. For example, the ECC circuit 180 may split the input data DT_in into the plurality of sub-data based on the structural characteristics of the memory cell array 110. The ECC circuit 180 may generate the plurality of sub-parity data by performing ECC encoding on each of a plurality of sub-data. The ECC circuit 180 may generate the write data DT_WR by performing a data scrambling operation on the plurality of sub-data and the plurality of sub-parity data based on the structural characteristics of the memory cell array 110. In this case, the write data DT_WR is generated such that 2-bit symbols corresponding to different sub-data are stored in memory cells corresponding to one local sense amplifier based on the structural characteristics of the memory cell array 110. Accordingly, even if an error of a specific pattern (e.g., a 4-bit error or an 8-bit error) occurs, normal error correction is possible.

In the above-described embodiments, the size of various data (e.g., input data, sub-data, sub-parity data, write data, read data, etc.) has been described as having a specific size, but the scope of the present disclosure is not limited thereto. For example, data (e.g., write data DT_WR) written to the memory cell array 110 may be set to have a multiple (e.g., 8 multiple) of a predetermined number based on the structural characteristics of the memory cell array 110. In this case, a size corresponding to one sub-data may be determined according to the number of ECC encoders. For example, as described with reference to FIG. 12, when the write data DT_WR is 32-bit 32*b*, the encoding schemes of the a-th and b-th ECC encoders 182*a*-1 and 182*b*-1 may be determined by using the (16,11) S2EC code. In this case, the input data DT_in will have a size of 22-bits 22*b*. However, the (16,11) S2EC code is for a minimum size of parity data for correcting a 2-bit symbol error, and the size of parity data may be larger than this. In detail, the encoding schemes of the a-th and b-th ECC encoders 182*a*-1 and 182*b*-1 may be determined by using a (16, 10) S2EC code. In this case, the input data DT_in will have a size of 20-bits 20*b*. As described above, a size of data may be variously modified.

Figure 19:
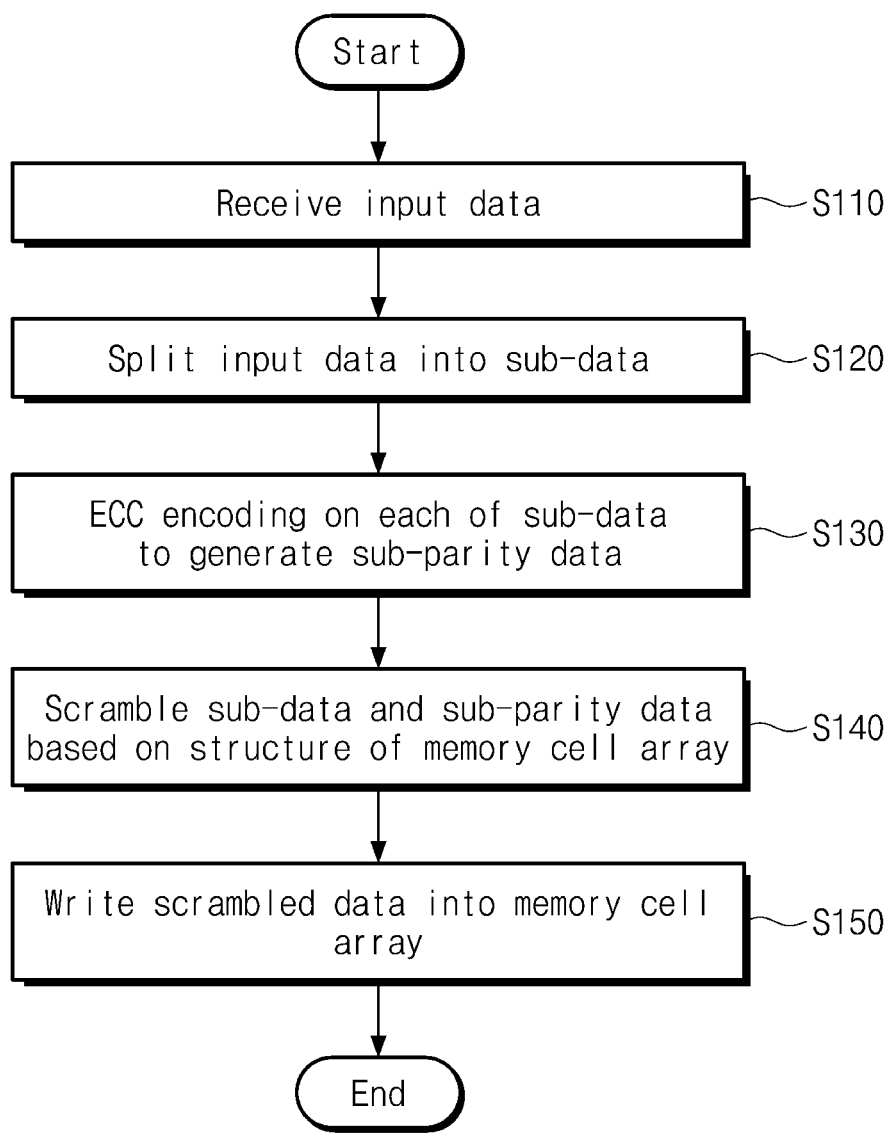
FIG. 19 is a flowchart illustrating an operation of ECC encoding according to an embodiment.

FIG. 19 is a flowchart illustrating an operation (e.g., ECC encoding) of a memory device of FIG. 1. Referring to FIGS. 1 and 19, in operation S110, the memory device 100 may receive the input data DT_in. In an embodiment, the input data DT_in may be data received from an external device (e.g., a memory controller). Alternatively, the input data DT_in may be data used or managed within the memory device 100. In an embodiment, the input data DT_in may be data (e.g., meta data, journal data, etc.) having a relatively small size managed by an external device or another processor.

In operation S120, the memory device 100 may split the input data into a plurality of sub-data. For example, the ECC circuit 180 of the memory device 100 may split the input data DT_in into the plurality of sub-data. In an embodiment, the size of each of the plurality of sub-data may be set according to the structural characteristics of the memory cell array 110 or the number of ECC encoders.

In operation S130, the memory device 100 may generate a plurality of sub-parity data by performing ECC encoding on each of the plurality of sub-data. For example, the ECC circuit 180 of the memory device 100 may perform ECC encoding on each of the plurality of sub-data. As a more detailed example, when the input data DT_in is split into a-th sub-data and b-th sub-data, ECC encoding may be performed on the a-th sub-data by the a-th ECC encoder, and ECC encoding may be performed on the b-th sub-data by the b-th ECC encoder. In an embodiment, each ECC encoding may be performed based on the S2EC code. Since ECC encoding is described with reference to FIGS. 1 to 18, additional description thereof will be omitted to avoid redundancy.

In operation S140, the memory device 100 may perform a data scrambling operation on the plurality of sub-data and the plurality of parity data based on the structure of the memory cell array 110. For example, the ECC circuit 180 of the memory device 100 may perform a data scrambling operation on the plurality of sub-data and the plurality of parity data based on the structure of the memory cell array 110 to generate the write data DT_WR. In an embodiment, the write data DT_WR may be generated such that data bits stored in memory cells corresponding to one local sense amplifier become 2-bit symbols corresponding to different sub-data. Since the data scrambling operation is described with reference to FIGS. 1 to 18, additional description thereof will be omitted to avoid redundancy.

In operation S150, the memory device 100 may store scrambled data (i.e., write data DT_WR) in the memory cell array 110. As described above, the write data DT_WR will be stored in the memory cell array 110 such that data bits stored in memory cells corresponding to one local sense amplifier become 2-bit symbols corresponding to different sub-data.

Figure 20:
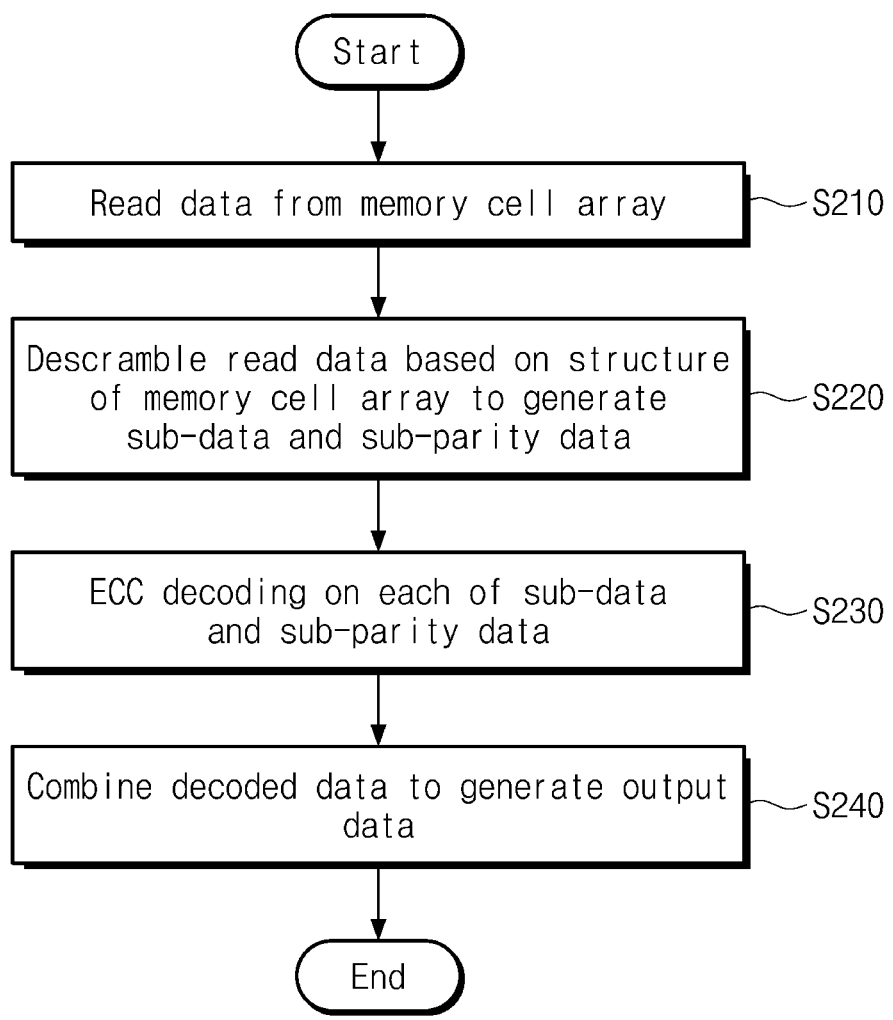
FIG. 20 is a flowchart illustrating an operation of ECC decoding according to an embodiment.

FIG. 20 is a flowchart illustrating an operation (e.g., ECC decoding) of a memory device of FIG. 1. Referring to FIGS. 1 and 20, in operation S210, the memory device 100 may read the read data DT_RD from the memory cell array 110. In an embodiment, the read data DT_RD may be data read at the request of an external device (e.g., a memory controller). Alternatively, the read data DT_RD may be data used or managed inside the memory device 100. In an embodiment, the read data DT_RD may be data (e.g., meta data, journal data, etc.) having a relatively small size managed by an external device or another processor.

In operation S220, the memory device 100 may generate the plurality of sub-data and the plurality of parity data by performing a data descramble operation on the read data DT_RD based on the structure of the memory cell array 110. For example, the ECC circuit 180 of the memory device 100 may perform the data descramble operation on the read data DT_RD. Since the descrambling operation is described with reference to FIGS. 1 to 18, additional description thereof will be omitted to avoid redundancy.

In operation S230, the memory device 100 may perform ECC decoding on each of the plurality of sub-data and the plurality of parity data. For example, the a-th sub-data, the a-th sub-parity data, the b-th sub-data, and the b-th sub-parity data may be generated through the data descrambling operation. In this case, ECC decoding may be performed on the a-th sub-data and the a-th sub-parity data by the a-th ECC decoder, and ECC decoding may be performed on the b-th sub-data and the b-th sub-parity data by the b-th ECC decoder. In an embodiment, each ECC decoding may be performed based on the S2EC code. ECC decoding is described with reference to FIGS. 1 and 18, and thus, additional description will be omitted to avoid redundancy.

In operation S240, the memory device 100 may generate output data by combining the decoded data (i.e., corrected sub-data). In an embodiment, output data may be provided to an external device (e.g., a memory controller). Alternatively, the output data may be used or managed by other circuitry of the memory device 100.

Figure 21:
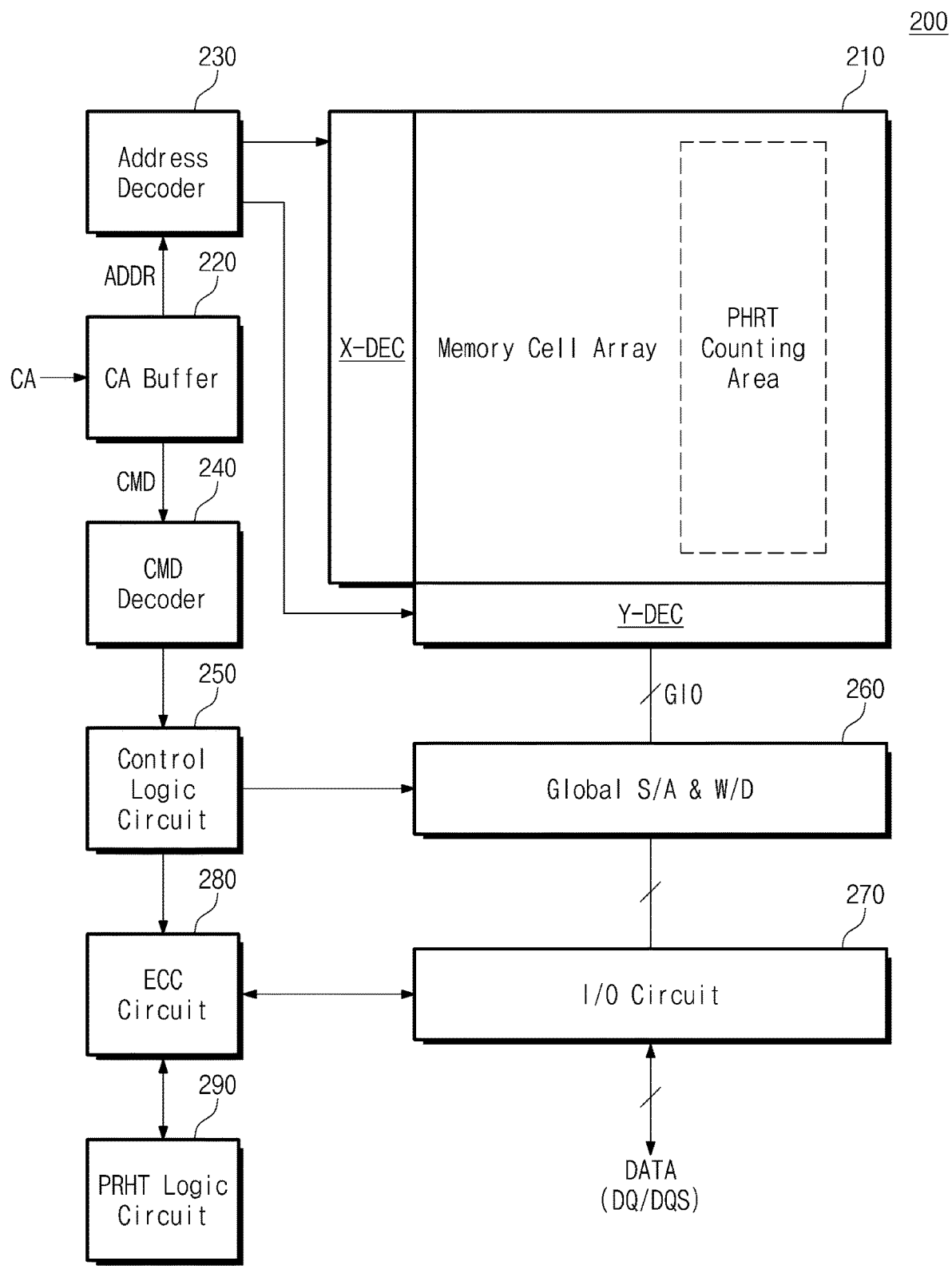
FIG. 21 is a block diagram illustrating a memory device, according to an embodiment of the present disclosure.

FIG. 21 is a block diagram illustrating a memory device according to an embodiment of the present disclosure. Referring to FIG. 21, a memory device 200 may include a memory cell array 210, a CA buffer 220, an address decoder 230, a command decoder 240, a control logic circuit 250, a global sense amplifier and write driver 260, an input/output circuit 270, an ECC circuit 280, and a perfect row hammer tracking (PRHT) logic circuit 290. The memory cell array 210, the CA buffer 220, the address decoder 230, the command decoder 240, the control logic circuit 250, the global sense amplifier and write driver 260, the input/output circuit 270, and ECC circuit 280 are similar to those described with reference to FIGS. 1 to 19, and thus, additional description will be omitted to avoid redundancy.

In an embodiment, the memory device 200 may further include the PRHT logic circuit 290. The PRHT logic circuit 290 may be configured to manage counting information. For example, the PRHT logic circuit 290 may include a counter that is configured to count a number of access to each wordline among a plurality of wordlines connected to the memory cell array 210. For example, in the memory device 200, when access with respect to a specific row (or specific word line) is repeatedly performed (e.g., row hammer attack), data in the specific row (or specific word line) may be lost. To prevent such data being lost from row hammer attack, additional refresh operations may be performed. The PRHT logic circuit 290 may manage the counting information for each of a plurality of rows (or a plurality of word lines). The counting information may indicate the number of accesses to each of the plurality of rows (or the plurality of word lines). In detail, the PRHT logic circuit 290 may update the counting information when access to each of the plurality of rows (or the plurality of word lines) is performed.

In an embodiment, the counting information may have a size of about 10-bits to 24-bits and may be stored in the memory cell array 110. For example, the counting information may be stored in a specific area or partial area (e.g., a PRHT counting area) of the memory cell array 110. The counting information stored in the memory cell array 110 may have a specific pattern of errors as described with reference to FIGS. 1 to 19. According to an embodiment of the present disclosure, the ECC circuit 280 may operate based on the methods described with reference to FIGS. 1 to 19 to correct errors in the counting information. For example, the input data DT_in described above with reference to FIGS. 1-19 may be counting information managed by (or stored in) the PRHT logic circuit 290.

In an embodiment, the counting information managed by the PRHT logic circuit 290 may be connected to memory cells connected to each of a plurality of word lines. In this case, the memory cells connected to each of the plurality of word lines may be configured to store corresponding counting information and corresponding user data. For example, first memory cells among a plurality of memory cells connected to the first word line may store user data accessed by an external device (e.g., a memory controller), and second memory cells among the plurality of memory cells connected to the first word line may store counting information with respect to the first word line, which is managed by the PRHT logic circuit 290. In this case, the ECC circuit 280 may perform ECC encoding and ECC decoding on the counting information with respect to the first word line managed by the PRHT logic circuit 290, and ECC encoding and ECC decoding with respect to the user data may be performed by a separate ECC circuit. However, the scope of the present disclosure is not limited thereto.

As described with reference to FIG. 21, the ECC circuit 280 according to an embodiment of the present disclosure may be configured to correct errors in counting information managed by the PRHT logic circuit 290. However, the scope of the present disclosure is not limited thereto. For example, data managed by the ECC circuit according to an embodiment of the present disclosure may include user data requested by an external device (e.g., a memory controller), metadata having a relatively small size, journal data, etc.

Figure 22:
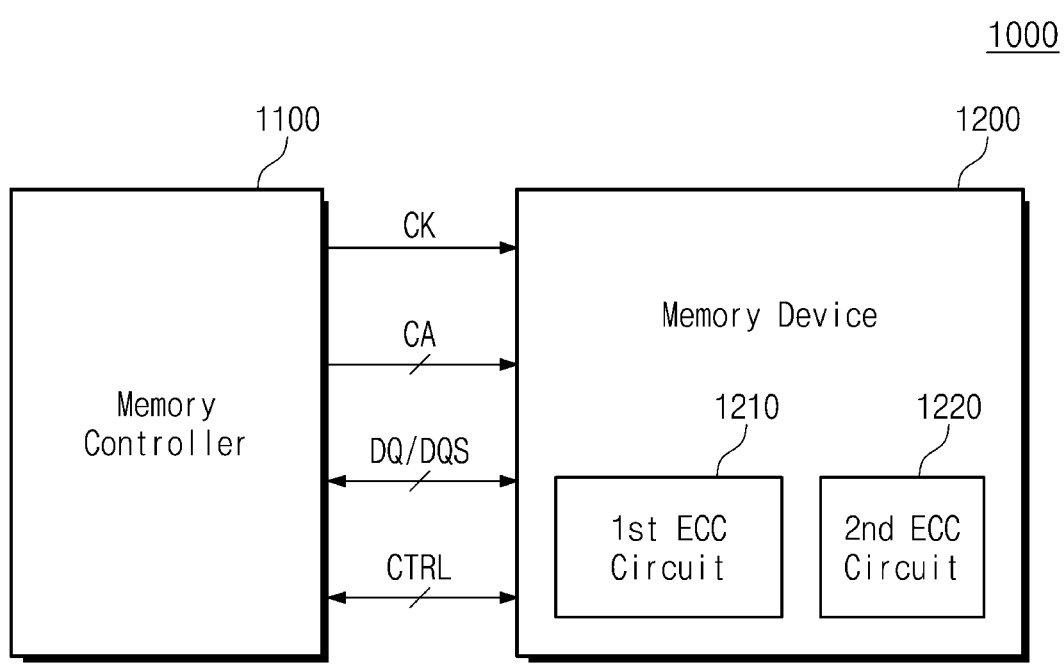
FIG. 22 is a block diagram illustrating a memory system, according to an embodiment of the present disclosure.

FIG. 22 is a block diagram illustrating a memory system, according to an embodiment of the present disclosure. Referring to FIG. 22, a memory system 1000 may include a memory controller 1100 and a memory device 1200. In an embodiment, the memory system 1000 may be one of information processing devices, which are configured to process various information and to store the processed information, such as a personal computer (PC), a laptop, a server, a workstation, a smartphone, a tablet PC, a digital camera, and a black box. Alternatively, the memory system 1000 may be a storage medium such as a solid state drive (SSD), and the memory device 1200 may be used as a buffer memory of the SSD. Alternatively, the memory system 1000 may be included in a graphics processing unit configured to perform various graphics processing or operations. However, the scope of the present disclosure is not limited thereto, and the memory system 1000 may be implemented in various forms.

The memory controller 1100 may store data in the memory device 1200 or may read data stored in the memory device 1200. For example, the memory controller 1100 may transmit a clock signal CK and a command/address signal CA to the memory device 1200, and may exchange a data signal DQ and a data strobe signal DQS with the memory device 1200. The memory controller 1100 may exchange various control signals CTRL with the memory device 1200. In an embodiment, data "DATA" may be transmitted from the memory controller 1100 to the memory device 1200 through the data signal DQ and the data strobe signal DQS, or may be transmitted from the memory device 1200 to the memory controller 1100. In an embodiment, the memory controller 1100 may be a system-on-chip (SoC) such as an application processor (AP).

The memory device 1200 may operate under control of the memory controller 1100. In an embodiment, the memory device 1200 may be a dynamic random access memory (DRAM) device, but the scope of the present disclosure is not limited thereto, and the memory device 1200 may include a volatile memory such as an SRAM, or a nonvolatile memory such as a flash memory, a PRAM, an MRAM, and/or an RRAM.

In an embodiment, the memory controller 1100 and the memory device 1200 may communicate with each other based on a predetermined interface. The predetermined interface may be a high-speed interface such as a double data rate (DDR) interface, a low-power DDR (LPDDR) interface, and a graphics DDR (GDDR) interface, but the present disclosure is not limited thereto. For example, the predetermined interface may include at least one of various interfaces such as a universal serial bus (USB), a multimedia card (MMC), a peripheral component interconnection (PCI), a PCI-express (PCI-E), an advanced technology attachment (ATA), a serial-ATA (SATA), a parallel-ATA (PATA), a small computer small interface (SCSI), an enhanced small disk interface (ESDI), an integrated drive electronics (IDE), a mobile industry processor interface (MIPI), and a nonvolatile memory-express (NVM-e).

In an embodiment, the memory device 1200 may include a first ECC circuit 1210 and a second ECC circuit 1220. The first ECC circuit 1210 and the second ECC circuit 1220 may be configured to correct errors in data stored in the memory device 1200. In an embodiment, the first ECC circuit 1210 may be configured to correct errors in user data accessed by the memory controller 1100. The second ECC circuit 1220 may be configured to correct errors in data (e.g., PRHT counting information) used or managed in the memory device 1200 (e.g., management data or metadata). In this case, the second ECC circuit 1220 may be the ECC circuit described with reference to FIGS. 1 to 21 or may operate based on methods described with reference to FIGS. 1 to 21. However, the scope of the present disclosure is not limited thereto, and the first and second ECC circuits 1210 and 1220 may operate in the manner described with reference to FIGS. 1 to 21.

Figure 23A:
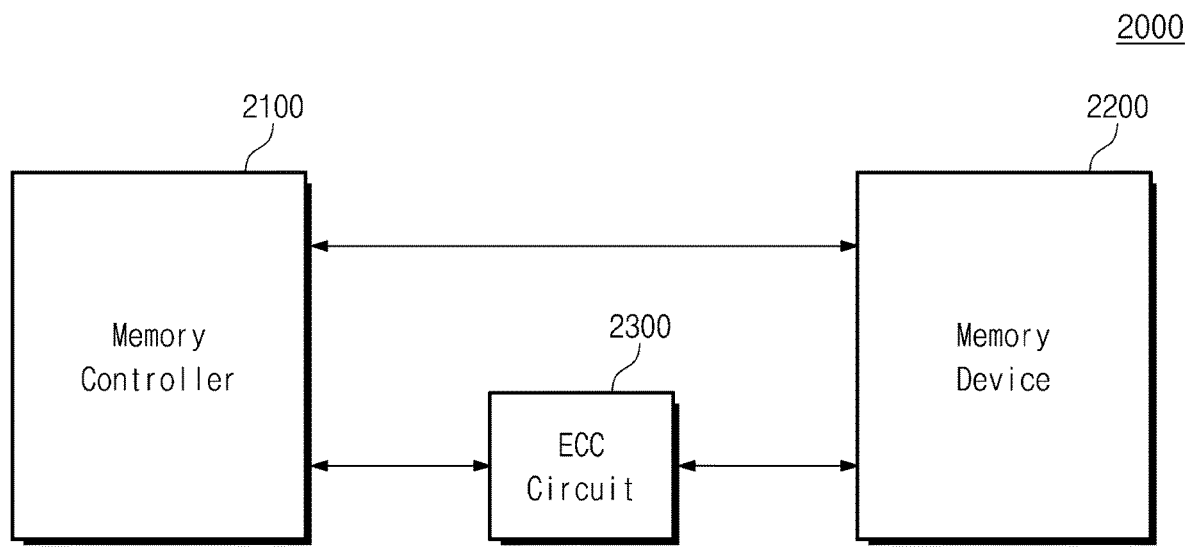
FIGS. 23A and 23B are block diagrams illustrating a memory system, according to an embodiment of the present disclosure.
Figure 23B:
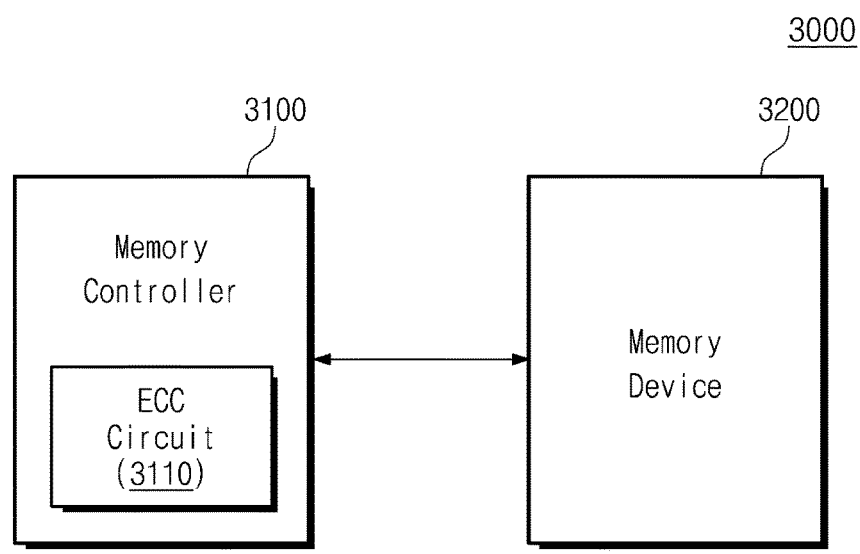

FIGS. 23A and 23B are block diagrams illustrating a memory system, according to an embodiment of the present disclosure. First, referring to FIG. 23A, a memory system 2000 may include a memory controller 2100, a memory device 2200, and an ECC circuit 2300. The memory controller 2100 may store data in the memory device 2200 or may read data stored in the memory device 2200. In an embodiment, the ECC circuit 2300 may be located in a data path between the memory controller 2100 and the memory device 2200. The ECC circuit 2300 may be configured to correct errors in data transmitted and received between the memory controller 2100 and the memory device 2200. In an embodiment, the ECC circuit 2300 may perform ECC encoding and ECC decoding based on the operating method described with reference to FIGS. 1 to 19. In an embodiment, the ECC circuit 2300 may perform ECC encoding and ECC decoding based on structural characteristics (in particular, structural characteristics of the memory cell array) of the memory device 2200 as described with reference to FIGS. 1 to 19.

Next, referring to FIG. 23B, the memory system 3000 may include a memory controller 3100 and a memory device 3200. The memory controller 3100 may store data in the memory device 3200 or may read data stored in the memory device 3200. In an embodiment, the memory controller 3100 may include an ECC circuit 3110. The ECC circuit 3110 may be configured to correct errors in data stored in the memory device 3200. In an embodiment, the ECC circuit 3110 may perform ECC encoding and ECC decoding based on the operating method described with reference to FIGS. 1 to 19. In an embodiment, the ECC circuit 3110 may perform ECC encoding and ECC decoding based on structural characteristics (in particular, structural characteristics of the memory cell array) of the memory device 3200 as described with reference to FIGS. 1 to 19.

Figure 24:
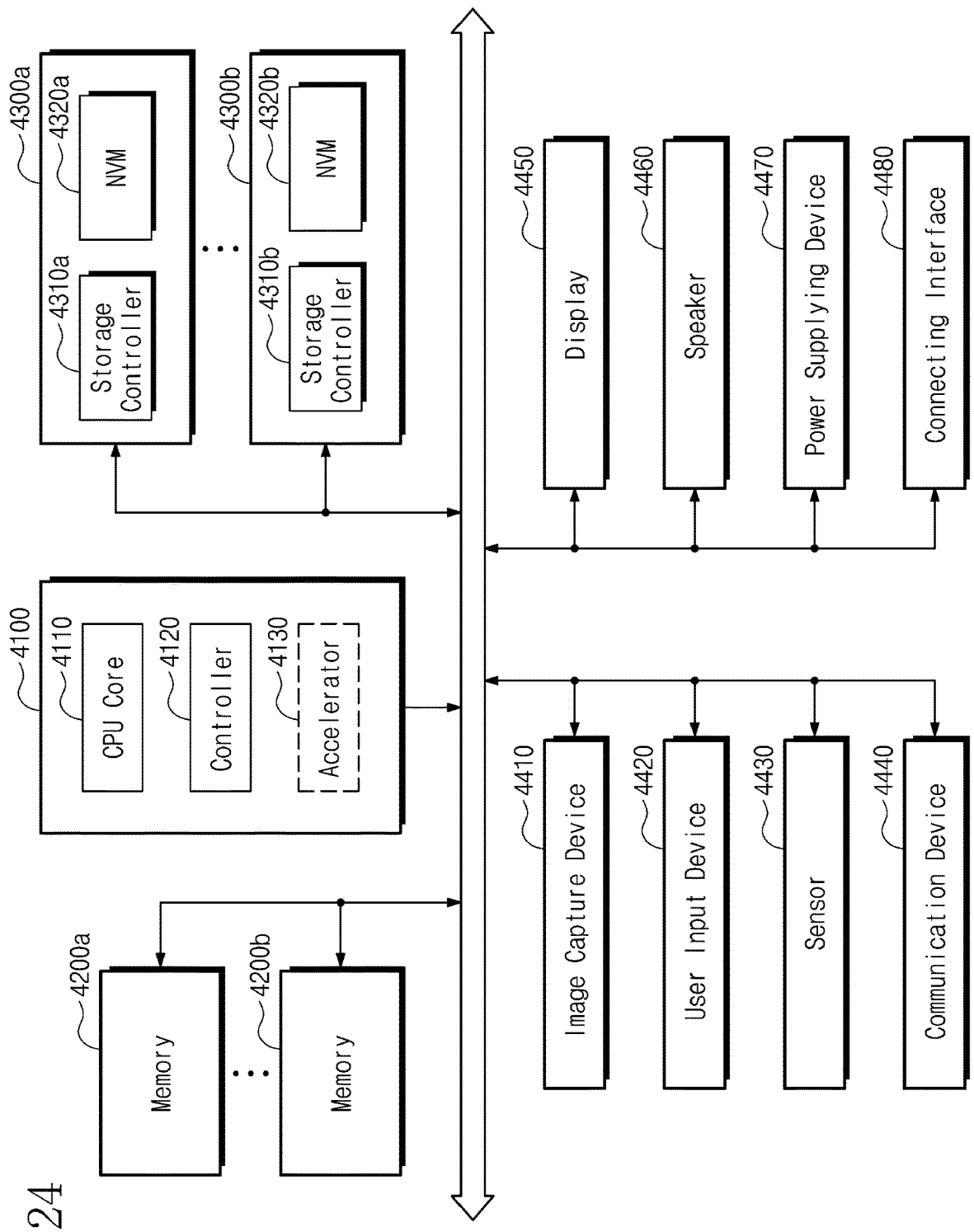
FIG. 24 is a diagram illustrating a system 4000, according to an embodiment of the present disclosure.

FIG. 24 is a diagram illustrating a system 4000, according to an embodiment of the present disclosure.

The system 4000 of FIG. 24 may basically be a mobile system, such as a portable communication terminal (e.g., a mobile phone), a smartphone, a tablet personal computer (PC), a wearable device, a healthcare device, or an Internet of things (IOT) device. However, the system 4000 of FIG. 24 is not necessarily limited to the mobile system and may be a PC, a laptop computer, a server, a media player, or an automotive device (e.g., a navigation device).

Referring to FIG. 24, the system 4000 may include a main processor 400, memories (e.g., 4200a and 4200b), and storage devices (e.g., 4300a and 4300b). In addition, the system 4000 may include at least one of an image capturing device 4410, a user input device 4420, a sensor 4430, a communication device 4440, a display AAA 1450, a speaker 4460, a power supplying device 4470, and a connecting interface 4480.

The main processor 4100 may control all operations of the system 4000, more specifically, operations of other components included in the system 4000. The main processor 4100 may be implemented as a general-purpose processor, a dedicated processor, or an application processor.

The main processor 4100 may include at least one CPU core 4110 and further include a controller 4120 configured to control the memories 4200a and 4200b and/or the storage devices 4300a and 4300b. In some embodiments, the main processor 4100 may further include an accelerator 4130, which is a dedicated circuit for a high-speed data operation, such as an artificial intelligence (AI) data operation. The accelerator 4130 may include a graphics processing unit (GPU), a neural processing unit (NPU) and/or a data processing unit (DPU) and be implemented as a chip that is physically separate from the other components of the main processor 4100.

The memories 4200a and 4200b may be used as main memory devices of the system 1000. Although each of the memories 4200a and 4200b may include a volatile memory, such as static random access memory (SRAM) and/or dynamic RAM (DRAM), each of the memories 4200a and 4200b may include non-volatile memory, such as a flash memory, phase-change RAM (PRAM) and/or resistive RAM (RRAM). The memories 4200a and 4200b may be implemented in the same package as the main processor 4100.

The storage devices 4300a and 4300b may serve as non-volatile storage devices configured to store data regardless of whether power is supplied thereto, and have larger storage capacity than the memories 4200a and 4200b. The storage devices 4300a and 4300b may respectively include storage controllers (STRG CTRL) 4310a and 4310b and NVM (Non-Volatile Memory)s 4320a and 4320b configured to store data via the control of the storage controllers 4310a and 4310b. Although the NVMs 4320a and 4320b may include flash memories having a two-dimensional (2D) structure or a three-dimensional (3D) V-NAND structure, the NVMs 4320a and 4320b may include other types of NVMs, such as PRAM and/or RRAM.

The storage devices 4300a and 4300b may be physically separated from the main processor 4100 and included in the system 4000 or implemented in the same package as the main processor 4100. In addition, the storage devices 4300a and 4300b may have types of solid-state devices (SSDs) or memory cards and be removably combined with other components of the system 4000 through an interface, such as the connecting interface 4480 that will be described below. The storage devices 4300a and 4300b may be devices to which a standard protocol, such as a universal flash storage (UFS), an embedded multi-media card (eMMC), or a non-volatile memory express (NVMe), is applied, without being limited thereto.

The image capturing device 4410 may capture still images or moving images. The image capturing device 4410 may include a camera, a camcorder, and/or a webcam.

The user input device 4420 may receive various types of data input by a user of the system 4000 and include a touch pad, a keypad, a keyboard, a mouse, and/or a microphone.

The sensor 4430 may detect various types of physical quantities, which may be obtained from the outside of the system 4000, and convert the detected physical quantities into electric signals. The sensor 4430 may include a temperature sensor, a pressure sensor, an illuminance sensor, a position sensor, an acceleration sensor, a biosensor, and/or a gyroscope sensor.

The communication device 4440 may transmit and receive signals between other devices outside the system 4000 according to various communication protocols. The communication device 4440 may include an antenna, a transceiver, and/or a modem.

The display 4450 and the speaker 4460 may serve as output devices configured to respectively output visual information and auditory information to the user of the system 4000.

The power supplying device 4470 may appropriately convert power supplied from a battery (not shown) embedded in the system 4000 and/or an external power source, and supply the converted power to each of components of the system 4000.

The connecting interface 4480 may provide connection between the system 4000 and an external device, which is connected to the system 4000 and capable of transmitting and receiving data to and from the system 4000. The connecting interface 4480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In an embodiment, the memories 4200a and 4200b may be the memory device described with reference to FIGS. 1 to 23b or may include the ECC circuit described with reference to FIGS. 1 to 23b. The memories 4200a and 4200b may operate based on the operation method described with reference to FIGS. 1 to 23b.

According to an embodiment of the present disclosure, since ECC encoding and ECC decoding are performed based on a structure of the memory cell array, errors of a specific pattern occurring in the memory device may be corrected. Accordingly, a memory device with improved reliability and an operation method thereof are provided.

The above descriptions are specific embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. Therefore, the scope of the present disclosure should not be limited to the above-described embodiments.

What is claimed is:

1. A memory device comprising:
   an error correction code (ECC) circuit configured to perform ECC encoding on input data to generate write data; and
   a memory cell array including a plurality of memory cells configured to store the write data, and
   wherein the ECC circuit includes:
   a data splitter configured to split the input data into first sub-data and second sub-data;
   a first ECC encoder configured to perform ECC encoding on the first sub-data to generate first sub-parity data;

a second ECC encoder configured to perform ECC encoding on the second sub-data to generate second sub-parity data; and a data scrambler configured to perform a data scrambling operation on the first sub-data, the second sub-data, the first sub-parity data, and the second sub-parity data based on a physical layout and/or electrical connections of circuits for the memory cell array to generate the write data.

2. The memory device of claim 1, wherein the memory cell array includes:
a first word line connected to the plurality of memory cells;
a plurality of bit lines respectively connected to the plurality of memory cells; and
a plurality of local sense amplifiers respectively connected to the plurality of bit lines and configured to operate in response to a plurality of column select signals.

3. The memory device of claim 2, further comprising:
a global sense amplifier and a write driver connected to the plurality of local sense amplifiers through global input/output lines; and
an input/output circuit configured to transmit and receive data to and from an external device and to transmit and receive data to and from the global sense amplifier and write driver.

4. The memory device of claim 2, wherein a first local sense amplifier among the plurality of local sense amplifiers operates in response to a first column select signal among the plurality of column select signals and is connected to first memory cells of the plurality of memory cells through first bit lines of the plurality of bit lines, and
wherein the first memory cells store a first 2-bit symbol corresponding to the first sub-data and a second 2-bit symbol corresponding to the second sub-data.

5. The memory device of claim 4, wherein a second local sense amplifier among the plurality of local sense amplifiers operates in response to the first column select signal among the plurality of column select signals and is connected to second memory cells of the plurality of memory cells through second bit lines of the plurality of bit lines, and
wherein the second memory cells store a third 2-bit symbol corresponding to the first sub-data and a fourth 2-bit symbol corresponding to the second sub-data.

6. The memory device of claim 5, wherein a third local sense amplifier among the plurality of local sense amplifiers operates in response to a second column select signal among the plurality of column select signals and is connected to third memory cells of the plurality of memory cells through third bit lines of the plurality of bit lines, and
wherein the third memory cells store a fifth 2-bit symbol corresponding to the first sub-data and a sixth 2-bit symbol corresponding to the second sub-data.

7. The memory device of claim 1, wherein the ECC circuit further includes:
a data descrambler configured to perform a data descramble operation with respect to read data read from the plurality of memory cells, based on the physical layout and/or electrical connections of circuits for the memory cell array to generate third sub-data, third sub-parity data, fourth sub-data, and fourth sub-parity data;
a first ECC decoder configured to perform ECC decoding on the third sub-data and the third sub-parity data to generate first corrected sub-data;

a second ECC decoder configured to perform ECC decoding on the fourth sub-data and the fourth sub-parity data to generate second corrected sub-data; and
a data combiner configured to combine the first corrected sub-data and the second corrected sub-data to generate output data.

8. The memory device of claim 7, wherein the first ECC encoder, the second ECC encoder, the first ECC decoder, and the second ECC decoder perform the ECC encoding and the ECC decoding, respectively, based on a single 2-bit-symbol error correction (S2EC) code.

9. The memory device of claim 8, wherein the input data has a size of 14-bits, each of the first sub-data and the second sub-data has a size of 7-bits, each of the first sub-parity data and the second sub-parity data has a size of 5-bits, and the write data has a size of 24-bits.

10. The memory device of claim 1, further comprising:
a perfect row hammer tracking (PRHT) logic circuit configured to store counting information, the counting information indicating a number of access counts with respect to a first word line connected to the plurality of memory cells.

11. The memory device of claim 10, wherein the input data is the counting information.

12. A memory device comprising:
a plurality of memory cells connected to a first word line and respectively connected to a plurality of bit lines;
a first local sense amplifier connected to first bit lines of the plurality of bit lines and configured to operate in response to a first column select signal;
a second local sense amplifier connected to second bit lines of the plurality of bit lines and configured to operate in response to the first column select signal; and
an error correction code (ECC) circuit configured to split input data into first sub-data and second sub-data, to perform a first ECC encoding on the first sub-data to generate first data code, to perform a second ECC encoding on the second sub-data to generate a second data code, and to generate write data based on the first data code and the second data code,
wherein the write data is stored in the plurality of memory cells, and
wherein first memory cells connected to the first bit lines among the plurality of memory cells store a first 2-bit symbol corresponding to the first data code and a second 2-bit symbol corresponding to the second data code.

13. The memory device of claim 12, wherein second memory cells connected to the second bit lines among the plurality of memory cells store a third 2-bit symbol corresponding to the first data code and a fourth 2-bit symbol corresponding to the second data code.

14. The memory device of claim 13, wherein the memory device further includes:
a third local sense amplifier connected to third bit lines among the plurality of bit lines and configured to operate in response to second column select signal, and
wherein third memory cells connected to the third bit lines among the plurality of memory cells store a fifth 2-bit symbol corresponding to the first data code and a sixth 2-bit symbol corresponding to the second data code.

15. The memory device of claim 12, wherein the ECC circuit is further configured to:
split read data read from the plurality of memory cells into third data code and fourth data code;
perform first ECC decoding on the third data code to generate first corrected sub-data;

perform second ECC decoding on the fourth data code to generate second corrected sub-data; and combine the first corrected sub-data and the second corrected sub-data to generate output data.

16. The memory device of claim 15, wherein the first ECC encoding, the second ECC encoding, the first ECC decoding, and the second ECC decoding are performed based on a single 2-bit-symbol error correction (S2EC) code.

17. The memory device of claim 12, wherein the input data includes counting information indicating the number of accesses with respect to the first word line.

18. A method of operating a memory device including a plurality of memory cells connected to a plurality of bit lines and a plurality of word lines, the method comprising:

dividing input data into first sub-data and second sub-data;

performing error correction code (ECC) encoding on the first sub-data and the second sub-data to generate first parity data and second parity data, respectively, the first data code including the first sub-data and the first parity data, and the second data code including the second sub-data and the second parity data;

performing a data scrambling operation on the first data code and the second data code to generate write data; and storing the write data in the plurality of memory cells, wherein the data scrambling operation includes:

scrambling the first data code to be stored through first bitlines among the plurality of bitlines, and scrambling the second data code to be stored through second bitlines among the plurality of bitlines, and wherein first memory cells among the plurality of memory cells connected to the first bit lines store 2-bit symbols corresponding to the first data code and second memory cells among the plurality of memory cells connected to the second bit lines store 2-bit symbols corresponding to the second data code.

19. The method of claim 18, further comprising:

reading read data from the plurality of memory cells;

dividing the read data into third data code and fourth data code;

generating a plurality of corrected sub-data by performing ECC decoding on each of the third data code and the fourth data code; and generating output data by combining the plurality of corrected sub-data.

20. The method of claim 19, wherein the ECC encoding and the ECC decoding are performed based on a single 2-bit-symbol error correction (S2EC) code.

* * * * *